US006225932B1

(12) United States Patent
Yanagihara

(10) Patent No.: US 6,225,932 B1
(45) Date of Patent: May 1, 2001

(54) COLOR PALETTE RAM AND D/A CONVERTER

(75) Inventor: Junichi Yanagihara, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/493,148

(22) Filed: Jan. 28, 2000

Related U.S. Application Data

(62) Division of application No. 09/092,907, filed on Jun. 8, 1998.

(30) Foreign Application Priority Data

Aug. 7, 1997 (JP) .................................................. 9-227216

(51) Int. Cl.[7] .................................................. H03M 1/66
(52) U.S. Cl. .......................... 341/144; 341/138; 341/145
(58) Field of Search .................................... 341/144, 133, 341/134, 136, 145, 153; 179/15 BA

(56) References Cited

U.S. PATENT DOCUMENTS 4,099,029 * 7/1978 Maruta et al. .................. 179/15 BA
4,885,581 * 12/1989 Sugawara et al. .................... 341/145
5,757,298 * 5/1998 Manley et al. ........................ 341/138

* cited by examiner

*Primary Examiner*—Brian Young
*Assistant Examiner*—John Nguyen
(74) *Attorney, Agent, or Firm*—Jones Volentine, LLC

(57) ABSTRACT

A color palette RAM 100 according to the present invention, which is provided with a RAM 101 for storing color information, an address register 102 that holds an input address and outputs an address to the RAM 101 and a comparator circuit 103 that compares the input address and the address output by the address register, outputs a match signal if these addresses match and stops the operation of the RAM 101 based upon the match signal, is capable of minimizing the level of the power consumed for precharge operations and the like, since the RAM can be set in a disabled state when the same address in the color palette RAM is accessed continuously, as is the case, for instance, when pixels of the same color lie adjacent to one another.

12 Claims, 27 Drawing Sheets

COC

FIG. 14

| INPUT | | | | OUTPUT |
|---|---|---|---|---|
| A[3] , B[3] | A[2] , B[2] | A[1] , B[1] | A[0] , B[0] | Y[0:3] |
| A[3] > B[3] | * | * | * | A[0:3] |
| A[3] < B[3] | * | * | * | B[0:3] |
| A[3] = B[3] | A[2] > B[2] | * | * | A[0:3] |
| A[3] = B[3] | A[2] < B[2] | * | * | B[0:3] |
| A[3] = B[3] | A[2] = B[2] | A[1] > B[1] | * | A[0:3] |
| A[3] = B[3] | A[2] = B[2] | A[1] < B[1] | * | B[0:3] |
| A[3] = B[3] | A[2] = B[2] | A[1] = B[1] | A[0] > B[0] | A[0:3] |
| A[3] = B[3] | A[2] = B[2] | A[1] = B[1] | A[0] < B[0] | B[0:3] |
| A[3] = B[3] | A[2] = B[2] | A[1] = B[1] | A[0] = B[0] | B[0:3] |

* : Don't Care

800

COLOR PALETTE RAM AND D/A CONVERTER

CROSS REFERENCE TO RELATED APPLICATIONS

This is a divisional application of application Ser. No. 09/092,907, filed Jun. 8, 1998, which is hereby incorporated by reference in its entirety for all purposes.

BACKGROUND OF THE INVENTION

The present invention relates to a color palette RAM and a D/A converter. In particular, it relates to a color palette RAM and a current output type D/A converter for graphics applications.

A schematic circuit diagram of a color palette RAM in the prior art is shown in FIG. 24. As illustrated in FIG. 24, the color palette RAM 10 in the prior art is provided with a RAM 11 for storing color data and an address register 12 that holds an address input via an address input terminal and outputs it to the RAM 11. The address register 12 holds an input address and outputs it to the RAM 11 at the rise of a clock pulse CLK. Then, at the following rise of the CLK pulse CLK, the RAM 11 outputs color data that corresponds to the address that has been output by the address register 12.

In addition, FIG. 25 presents a schematic circuit diagram of a current output type D/A converter for graphics applications in the prior art. It is to be noted that in the example in FIG. 25, the D/A converter has a resolution of 4 bits. As illustrated in the figure, 4-bit color data are input via a color data input terminal to the D [0:3] terminal of a data register 23, and a signal output from the OUT [0:3] terminal of the data register 23 is input to the D [0:3] terminal of a decoder 22. A decode signal output from the SELECT [0:14] terminal of the decoder 22 is input to the SELECT [0:14] terminal of a current conversion circuit 21, and the signal output from the AN_OUT terminal of the current conversion circuit 21 constitutes the D/A converter output signal. In addition, a clock pulse CLK is input via the CLK input terminal to the data register 23 and the decoder 22.

A circuit diagram of the current conversion circuit 21, which converts input color data to a current for output, is presented in FIG. 26. As illustrated in FIG. 26, a plurality of current output circuits COC, e.g. 15 current output circuits COC, each of which outputs a constant current, are provided in the current conversion circuit 21, and current output circuits COC are selected with a SELECT signal provided by the decoder 22 in a quantity that corresponds to the input color data, so that the total current output from the current output circuits COC selected by the SELECT signal is output from the AN_OUT terminal of the current conversion circuit 21 to constitute the output signal of the D/A converter.

In addition, a circuit diagram that represents an example of a current output circuit COC is shown in FIG. 27. As illustrated in FIG. 27, the current output circuit COC is provided with a current source 30 for outputting a constant current, which is constituted of a PMOS transistor 30*a* and a PMOS transistor 30*b* whereby a selection is made as to whether the output current from the current source 30 is to be output from the I_OUT terminal or discharged to the ground by using switching elements (a PMOS transistor 31 and a PMOS transistor 32) based upon the SELECT signal provided by the decoder 22.

The structure described above is adopted because, when control is implemented to operate/stop the current source 30 based upon the SELECT signal, a certain length of time is required before the output current from the current source 30 becomes stabilized after the current source 30 is switched from the stopped state to the operating state and, in order to operate the D/A converter at high speed, it is therefore necessary that the current source 30 output a constant current at all times.

Next, the operation of the D/A converter illustrated in FIG. 25 is explained in reference to FIG. 28. In FIG. 28, a timing chart corresponding to the circuit diagram in FIG. 25 is presented. As illustrated in FIG. 28, when color data "0000" are input via the color data input terminal, the data register 23 holds the color data "0000" and outputs them to the decoder 22 at the following rise of the CLK. Then, at the following rise of the CLK, the decoder 22 outputs a SELECT signal for selecting the current output circuits COC in the current conversion circuit 21 based upon the color data output by the data register 23.

Through this process, when the color data "0000" are input via the color data input terminal, the signal output from the SELECT [0:14] terminal of the decoder 22 is "0000 h," with the result that no current output circuits COC in the current conversion circuit 21 shown in FIG. 26 are selected. This sets the level of the current output from the analog output terminal of the D/A converter to 0.

However, when color data "0001" are input via the color data input terminal, the decoder 22 outputs a signal "0001 h," which corresponds to the color data "0001" from the SELECT [0:14] terminal, resulting in the current output circuit COC [1] in the current conversion circuit 21 being selected, to set the level of the current output from the analog output terminal to 1.

Likewise, when color data "0010" are input, the signal output from the SELECT [0:14] terminal is "0003 h," resulting in two current output circuits COC, i.e., the current output circuit COC [1] and the current output circuit COC [2], being selected, to set the level of the current output from the analog output terminal to 2.

In addition, when color data "1000" are input, the signal output from the SELECT [0:14] terminal is "00 FFh," resulting in eight current output circuits COC, i.e., the current output circuits COC [1] through [8], being selected, to set the level of the current output from the analog output terminal to 8.

Furthermore, when color data "1111" are input, the signal output from the SELECT [0:14] terminal is "7 FFFh," resulting in all the current output circuits COC being selected, to set the level of the current output from the analog output terminal to 15.

It is to be noted that, since the operation of the current sources 30 in the unselected current output circuits COC do not stop, as explained earlier, the output currents from the current sources 30 at the unselected current output circuits COC are discharged to the ground.

As explained above, in the current output type D/A converter in the prior art, the data register 23, the decoder 22 and the current conversion circuit 21 are provided, with the data register 23 holding input color data to output it to the decoder 22 at the rise of the CLK pulse. Then, at the following rise of the CLK pulse, the decoder 22 outputs the SELECT signal to the current conversion circuit 21 in correspondence to the color data output from the data register 23, and the current conversion circuit 21, in turn, outputs a current based upon the SELECT signal provided by the decoder 22.

However, in the color palette RAM in the prior art structured as described above, since a clock pulse is supplied to the RAM 1 even when a single address is input continuously with the consequence that the output data from the color palette RAM do not change, operations such as precharge are performed continuously. Performing these operations continuously causes an increase in power consumption, which works against the need for reduced power consumption.

In addition, in the current output type D/A converter structured as described above, in which the currents are output from the I_OUT terminals of the current output circuits COC in the current conversion circuit 21 that have been selected by the decoder 22, the output currents from unselected current output circuits COC are discharged to the ground with currents flowing constantly from the current source 30 in all the current output circuits COC regardless of input color data. Thus, this operation also causes an increase in power consumption which works against the need for reduced power consumption.

OBJECTS AND SUMMARY OF THE INVENTION

An object of the present invention, which has been completed by addressing the problems in color palette RAM in the prior art discussed above, is to provide a new and improved low power consumption type color palette RAM that is capable of reducing the quantity of power consumed in precharge operations and the like by setting the RAM in a disabled state when a single address is input continuously.

Another object of the present invention is to provide a new and improved low power consumption type D/A converter that is capable of leaving the current output circuits in the stopped state when they are not selected and setting selected current output circuits in the operating state in advance to assure stable output current by effectively controlling the operating/stopped states of the current output circuits in the current conversion circuit.

Yet another object of the present invention is to provide a new and improved current output type D/A converter for graphics applications that is versatile, capable of supporting higher operating frequencies and also capable of effectively reducing the power consumption, in particular when color data continue unchanged, without increasing the circuit scale.

In order to achieve the objects described above, in a first aspect of the present invention, a color palette RAM that outputs color information is provided. This color palette RAM is characterized in that it is provided with a RAM for storing color information, an address register that holds an input address and outputs an address to the RAM and a comparator circuit that compares the input address and the address output by the address register and outputs a match signal when the addresses are matched to stop the operation of the RAM based upon the match signal.

In this structure, when a single address in the color palette RAM is accessed continuously, e.g., in the case of adjacent pixels of the same color, the RAM can be set in a disabled state, thereby making it possible to reduce the power consumed for precharge operations and the like.

In addition, by constituting the color palette RAM in such a manner that the operation of the address register 2, too, is stopped based upon the match signal provided by the comparator circuit, the address register can be stopped, and the RAM set in a disabled state, to further reduce the power consumption at the color palette RAM.

Furthermore, in a second aspect of the present invention, a D/A converter that converts a digital signal to a current value is provided. This D/A converter is characterized in that it is provided with a decoder that outputs a first decode signal that corresponds to digital data, a decode signal register that holds the first decode signal from the decoder and outputs a second decode signal, a bit adder circuit that generates a third decode signal having the same bit length as the first and second decode signal by adding common bits in the first decode signal from the decoder and the second decode signal from the decode signal register and a current conversion circuit having a plurality of current output circuits whose operating/stopped states are switched in correspondence to the third decode signal, that outputs a current value that corresponds to the number of current output circuits selected in correspondence to the second decode signal.

In this structure, since unselected current output circuits stand by in the stopped state, power consumption is reduced. In addition, even when a current output circuit in the stopped state is to be selected, it is possible to switch it to the operating state one clock pulse in advance of the time that is actually selected, thereby assuring the period of time required for the output current from the current output circuit to stabilize.

In addition, the decode signal register may be constituted by connecting a group of decode signal sub-registers in cascade over a plurality of stages so that the bit adder circuit generates the third decode signal by adding common bits in a plurality of second decode signals from the individual decode signal sub-registers in the group and the first decode signal.

In this structure, even when the operating clock frequency becomes higher, selected current output circuits can be set in the operating state in advance by an arbitrary number of clock pulses by connecting a group of decode signal sub-registers in cascadeover a plurality of stages, to support a higher speeds in the system.

Moreover, in a third aspect of the present invention, a D/A converter that converts a digital signal to a current value is provided. This D/A converter is characterized in that it is provided with a data register that holds first digital data that have been input and outputs second digital data, a first decoder that outputs a first decode signal that corresponds to the second digital data, a data selection circuit that compares the size of the first digital data with the size of the second digital data from the data register and outputs third digital data, a second decoder that outputs a second decode signal which corresponds to the third digital data and a current conversion circuit having a plurality of current output circuits whose operating/stopped states are switched in correspondence to the second decode signal, that outputs a current value corresponding to the number of current output circuits selected in conformance to the first decode signal.

In this structure, too, since unselected current output circuits stand by in the stopped state, power consumption can be reduced. In addition, even when a current output circuit in the stopped state is to be selected, it is possible to switch it to the operating state one clock pulse in advance of the time that is actually selected, thereby assuring the period of time required for the output current from the current output circuit to stabilize.

Furthermore, the data register may be constituted by connecting a group of data sub-registers in cascade over a plurality of stages so that the data selection circuit compares a plurality of sets of first digital data input to the individual data sub-registers in the group with a plurality of sets of second digital data output from the individual data sub-registers in the group.

In this structure, even when the operating clock frequency becomes higher, selected current output circuits can be set in the operating state in advance by an arbitrary number of clock pulses by connecting a group of data sub-registers in cascade over a plurality of stages, to support a higher speeds in the system.

In addition, by providing a plurality of current output circuits that are weighted by a factor of $2^n$ (n=0, 1, 2, . . . ) in the current converter circuit, the scale of the current conversion circuit can be further reduced, to achieve a further reduction in power consumption and to further reduce the area occupied by the D/A converter.

Moreover, in the D/A converter that converts a digital signal to a current value according to the present invention, the digital signal may be divided into a plurality of digital sub-signals and the individual digital sub-signals may be converted to specific current sub-values by a plurality of D/A sub-converters having an identical structure to that of the D/A converter described above before they are synthesized.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings:

FIG. 14 illustrates the states of the decision-making values in the data selection circuit shown in FIG. 13;

DETAILED DESCRIPTION OF THE PREFERRED EMBODIMENTS

The following is a detailed explanation of preferred embodiments of the color palette RAM and the current output type D/A converter according to the present invention in reference to the attached drawings. It is to be noted that in the following explanation, the same reference numbers are assigned to members having identical structure and function to avoid repeated explanation.

(First embodiment)

Figure 1:
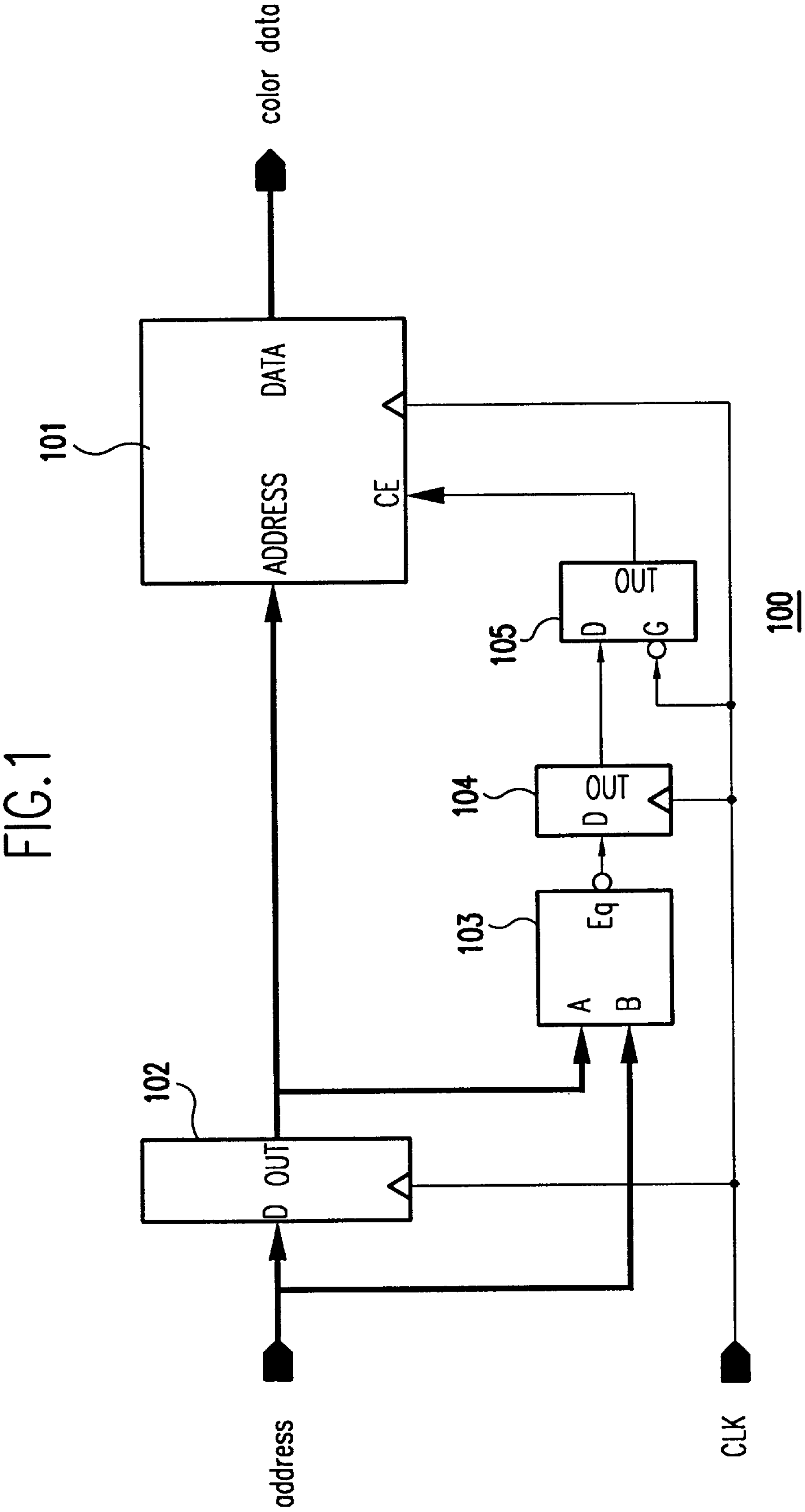
FIG. 1 is a circuit diagram illustrating a schematic structure of the color palette RAM in a first embodiment of the present invention.
Figure 2:
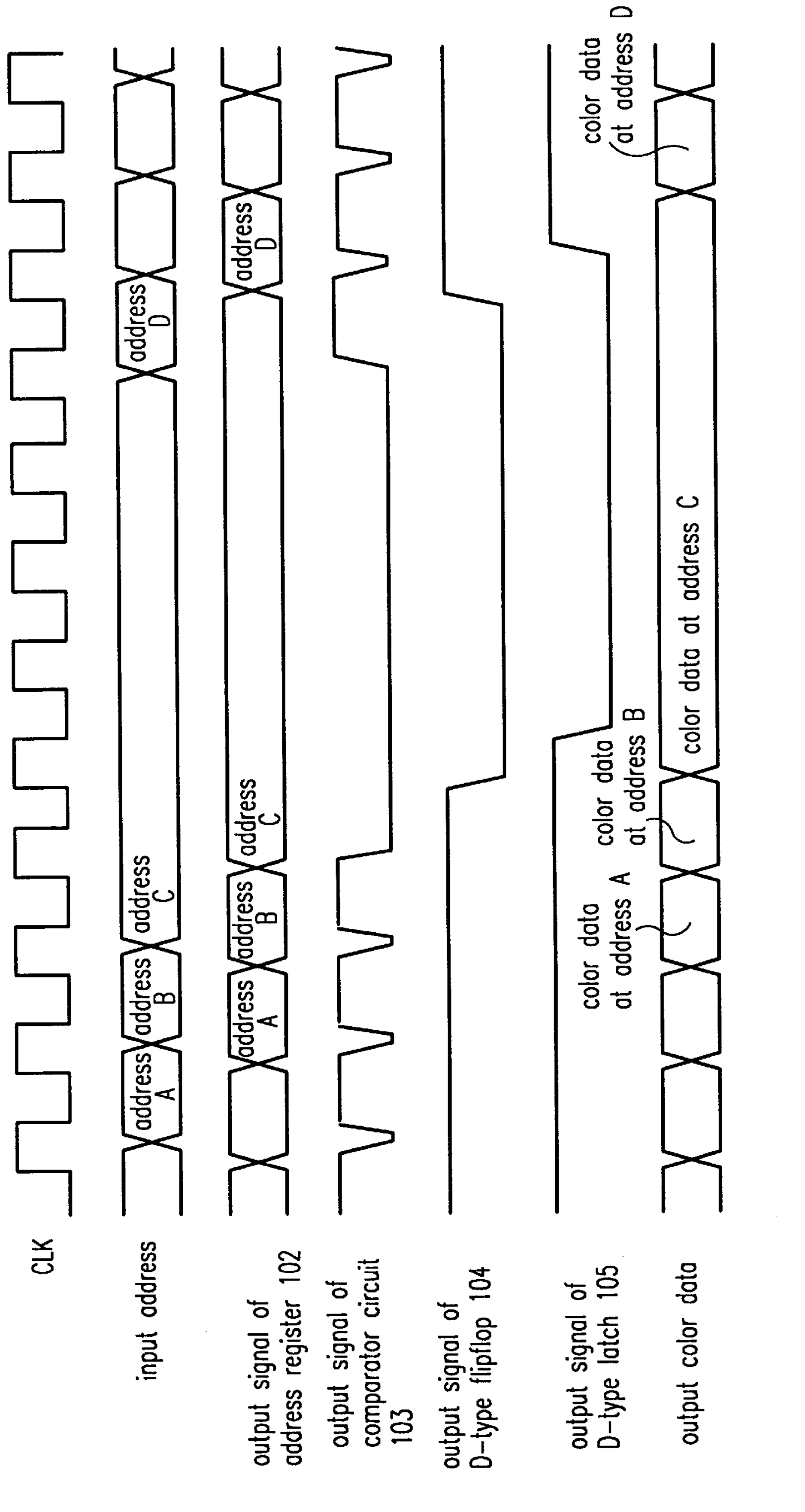
FIG. 2 is a timing chart illustrating the operation of the color palette RAM in the first embodiment of the present invention.

First, in reference to FIGS. 1 and 2, the structure and the operation of the color palette RAM in the first embodiment of the present invention are explained.

FIG. 1 is a circuit diagram illustrating a schematic structure of a color palette RAM 100 in the first embodiment of the present invention. As shown in FIG. 1, an address input terminal is commonly connected to the D terminal of an address register 102 and the B terminal of a comparator circuit 103. The OUT terminal of the address register 102 is connected to the ADDRESS terminal of a RAM 101 and the A terminal of the comparator circuit 103. In addition, the Eq terminal of the comparator circuit 103 is connected to the D terminal of a D-type flipflop 104, with the OUT terminal of the D-type flipflop 104 connected to the D terminal of a D-type latch 105 and the OUT terminal of the D-type latch 105 connected to the CE terminal of the RAM 101.

In addition, a CLK input terminal is connected to the CLK terminal of the RAM 101, the CLK terminal of the address register 102, the CLK terminal of the D-type flipflop 104 and the G terminal of the D-type latch 105.

Furthermore, the DATA terminal of the RAM 101 is connected to a data output terminal so that output data from the RAM 101 constitute the output data of the color palette RAM.

Next, the operation of the color palette RAM illustrated in FIG. 1 is explained in reference to the timing chart in FIG. 2. As shown in FIG. 2, when an address A is input via the address input terminal, the address register 102 holds the address A and outputs it to the RAM 101 and the comparator circuit 103 at the following rise of the CLK. The RAM 101 with the address A input, outputs the color data stored at address A at the following rise of the CLK.

In addition, the output signal of the comparator circuit 103 which shifts from high level to low level when the address input signal is matched at the point in time at which the address register 102 outputs the address A. Then the output signal of the comparator 103 is set to high again when the next address B is input via the address input terminal.

Likewise, when the address B output from the address register 102 is input to the RAM 101, the RAM 101 outputs the color data stored at the address B at the following rise of the CLK. At the comparator circuit 103, too, whose output signal shifts from high to low when the address input signal is matched at the point in time at which the address register 102 outputs the address B, the output signal is set to high again when the next address C is input via the address input terminal. Likewise, when the next address C is input via the address input terminal, the address register 102 outputs the address C at the following rise of the CLK to set the output signal of the comparator circuit 103 to low. Then, at the following rise of the CLK, the color data stored at the address C are output from the RAM 101, and the output signal of the D-type flipflop 104 is set to low. When the output signal of the D-type flipflop 104 is set to low, the output signal of the D-type latch 105 is set to low at the following fall of the CLK. This sets the RAM 101 in a disabled state to hold the output signal.

Next, when an address D is input via the address input terminal, the comparator circuit 103 is set to high. Then, at the following rise of the CLK, the address register 102 outputs the address D, and the output signal of the D-type flipflop 104 is set to high. When the output signal of the D-type flipflop 104 is set to high, the output signal of the D-type latch 105 is set to high at the following fall of the CLK to set the RAM 101 in an enabled state, and the color data stored at the address D are output from the RAM 101 at the following rise of the CLK.

As has been explained, in the color palette RAM 100 in the first embodiment of the present invention, when the same address is input successively, the D-type flipflop 104 and the D-type latch 105 function to set the RAM 101 in a disabled state, thereby stopping the supply of the clock pulse into the RAM 101. As a result, the power consumed in precharge operations and the like is minimized. Since the possibility of pixels of the same color lying adjacent to one another is high and, therefore, the likelihood of a single address in the color palette RAM being accessed successively is high, the advantage of the color palette RAM 100 in this embodiment is expected to manifest particularly effectively in the case of text-based applications such as text preparation, table calculation and the like.

(Second embodiment)

While, in the color palette RAM 100 in the first embodiment explained above, only the RAM 101 is set in a disabled state when the same address is input, the color palette RAM may be structured so that the address register 102, too, is made to stop operating. A schematic circuit structure of a color palette RAM 200 in the second embodiment of the present invention, which is capable of setting a RAM 201 in a disabled state and stopping an address register 202 when the same address is input in this manner, is illustrated in FIG. 3.

Figure 3:
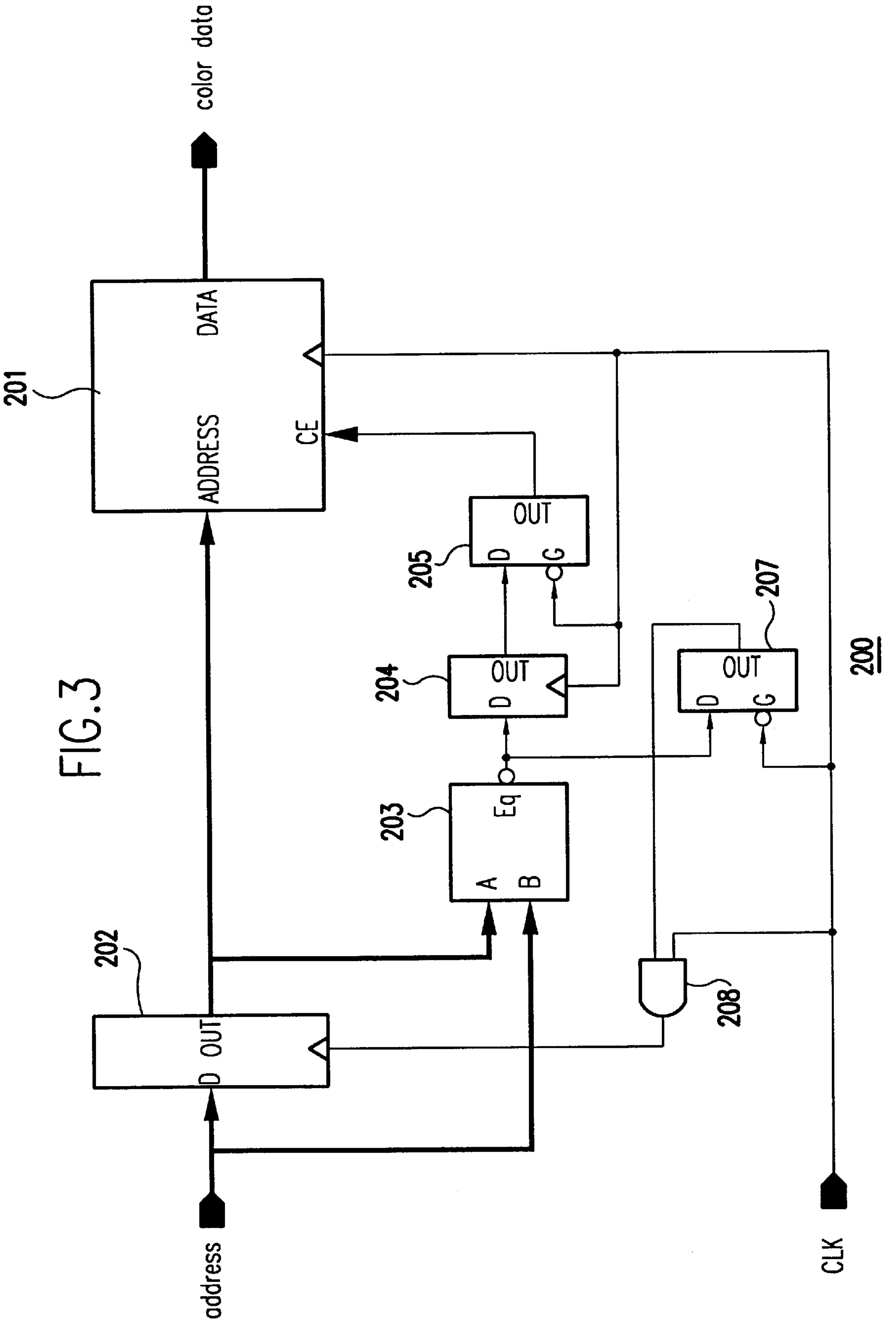
FIG. 3 is a circuit diagram illustrating a schematic structure of the color palette RAM in a second embodiment of the present invention.

As shown in FIG. 3, in the color palette RAM 200 in the second embodiment, the address input terminal is connected to the D terminal of the address register 202 and the B terminal of a comparator circuit 203. In addition, the OUT terminal of the address register 202 is connected to the ADDRESS terminal of the RAM 201 and the A terminal of the comparator circuit 203. The Eq terminal of the comparator circuit 203 is connected to the D terminal of a D-type flipflop 204 and the D terminal of a D-type latch 207. Moreover, the OUT terminal of the D-type flipflop 204 is connected to the D terminal of a D-type latch 205, the OUT terminal of the D-type latch 207 is connected to the CE terminal of the RAM 201, the OUT terminal the D-type latch 205 is connected to an input terminal of a two-input AND gate 208 and the output terminal of the two-input AND gate is connected to the CLK terminal of the address register 202.

In addition, a CLK input terminal is connected to the CLK terminal of the RAM 201, the CLK terminal of the D-type flipflop 204, the G terminal of the D-type latch 205, the G terminal of the D-type latch 207 and the other input terminal of the two-input AND gate 208.

Moreover, the DATA terminal of the RAM 201 is connected to a data output terminal so that the output signal from the RAM 201 constitutes the output data of the color palette RAM 200.

Figure 4:
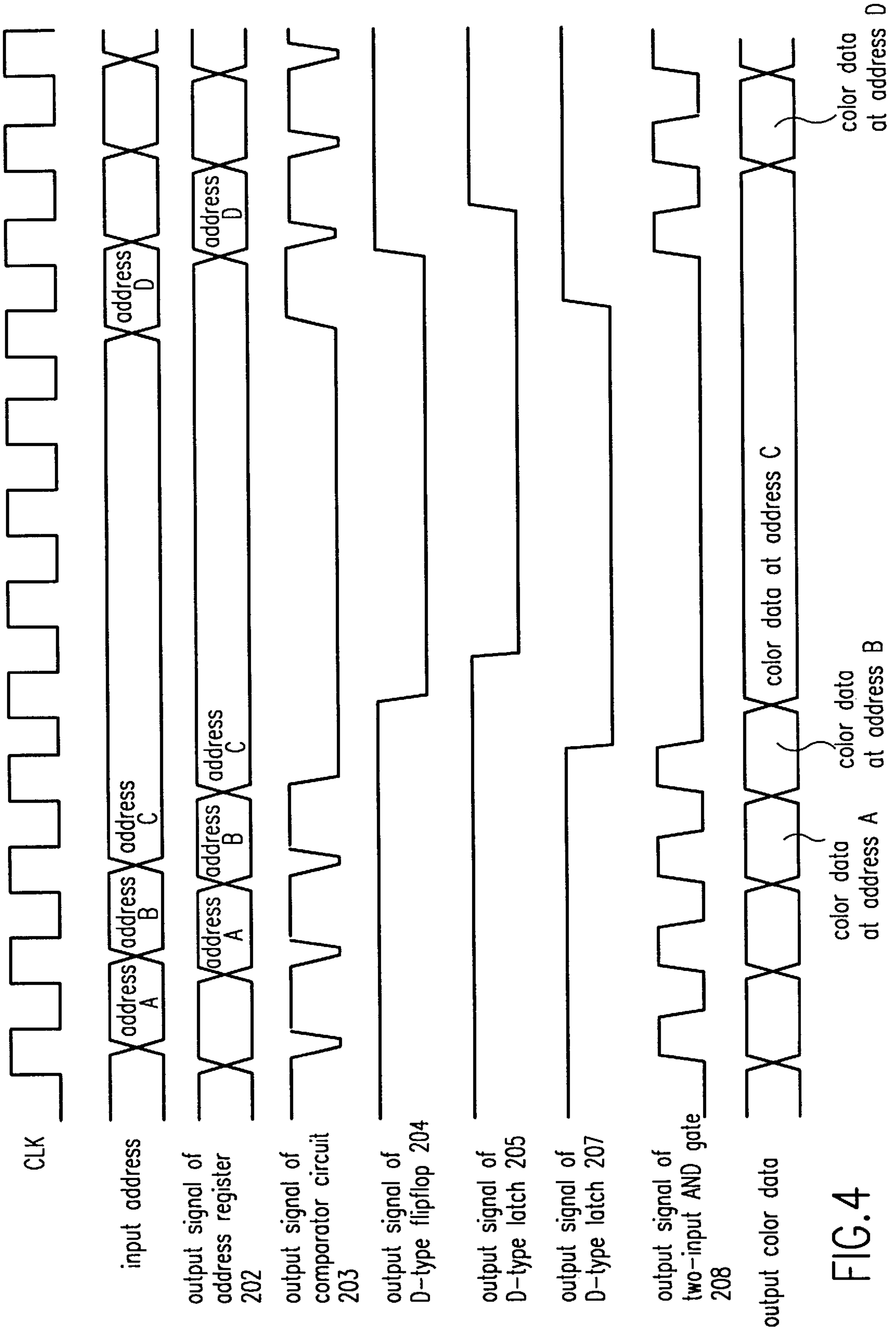
FIG. 4 is a timing chart illustrating the operation of the color palette RAM in the second embodiment of the present invention.

Next, the operation of the color palette RAM 200 illustrated in FIG. 3 is explained in reference to the timing chart in FIG. 4. As shown in FIG. 4, when an address A is input via the address input terminal, the address register 202 holds the address A and, at the following rise of the output signal of the two-input AND gate 208, outputs it to the RAM 201 and the comparator circuit 103. The RAM 201 with the address A input, outputs the color data stored at address A at the following rise of the CLK.

In addition, the output signal of the comparator circuit 203 which shifts from high level to low level when the address input signal is matched at the point in time at which the address register 202 outputs the address A, is set to high again when the next address B is input via the address input terminal.

Likewise, when the address B output from the address register 202 is input to the RAM 201 at the following rise of the CLK, the RAM 201 outputs the color data stored at the address B. At the comparator circuit 203, too, whose output signal shifts from high to low when the address input signal is matched at the point in time at which the address register 202 outputs the address B, the output signal is set to high again when the next address C is input via the address input terminal. Likewise, when the next address C is input via the address input terminal next, the address register 202 outputs the address C at the following rise of the output signal of the two-input AND gate 208 to set the output signal of the comparator circuit 203 to low. Then, at the following fall of the CLK, the output signal of the D-type latch 207 is set to low, and the output signal of the two-input AND gate 208 is fixed at low. As a result, the supply of the clock pulse to the address register 202 is stopped and the address register 202 holds the output signal.

At the following rise of the CLK after the address register 202 has output the address C, the color data stored at the address C are output from the RAM 201, and the output signal of the D-type flipflop 204 is set to low. Then, with the output signal of the D-type flipflop 204 set to low, the output signal of the D-type latch 205 is set to low at the following fall of the CLK. This sets the RAM 201 in a disabled state and the output signal is held.

Next, when the next address D is input via the address input terminal, the comparator circuit 203 is set to high. Then, at the following fall of the CLK, the output signal of the D-type latch 207 is set to high, thereby enabling the supply of the clock pulse to the address register 202, and the address register 202 outputs the address D at the rise of the output signal of the two-input AND gate 208. In addition, at the following rise of the CLK, after the comparator circuit 203 has shifted to high, the output signal of the D-type flipflop 204 is set to high, and at the following fall of the CLK, the output signal of the D-type latch 205 is set to high. When the output signal of the D-type latch 205 is set to high, the RAM 201 enters an enabled state, and outputs the color data stored at the address D at the following rise of the CLK.

As has been explained, in the color palette RAM 200 in the second embodiment of the present invention, since when the same address is input, D-type flipflop 204 and the D-type latches 205 and 207 function to stop the operation of the address register 202 as well as to set the RAM 201 in a disabled state, the advantage of reducing the power consumption is expected to be realized to a greater degree than that achieved by the color palette RAM 100 in the first embodiment of the present invention.

(Third embodiment)

Figure 5:
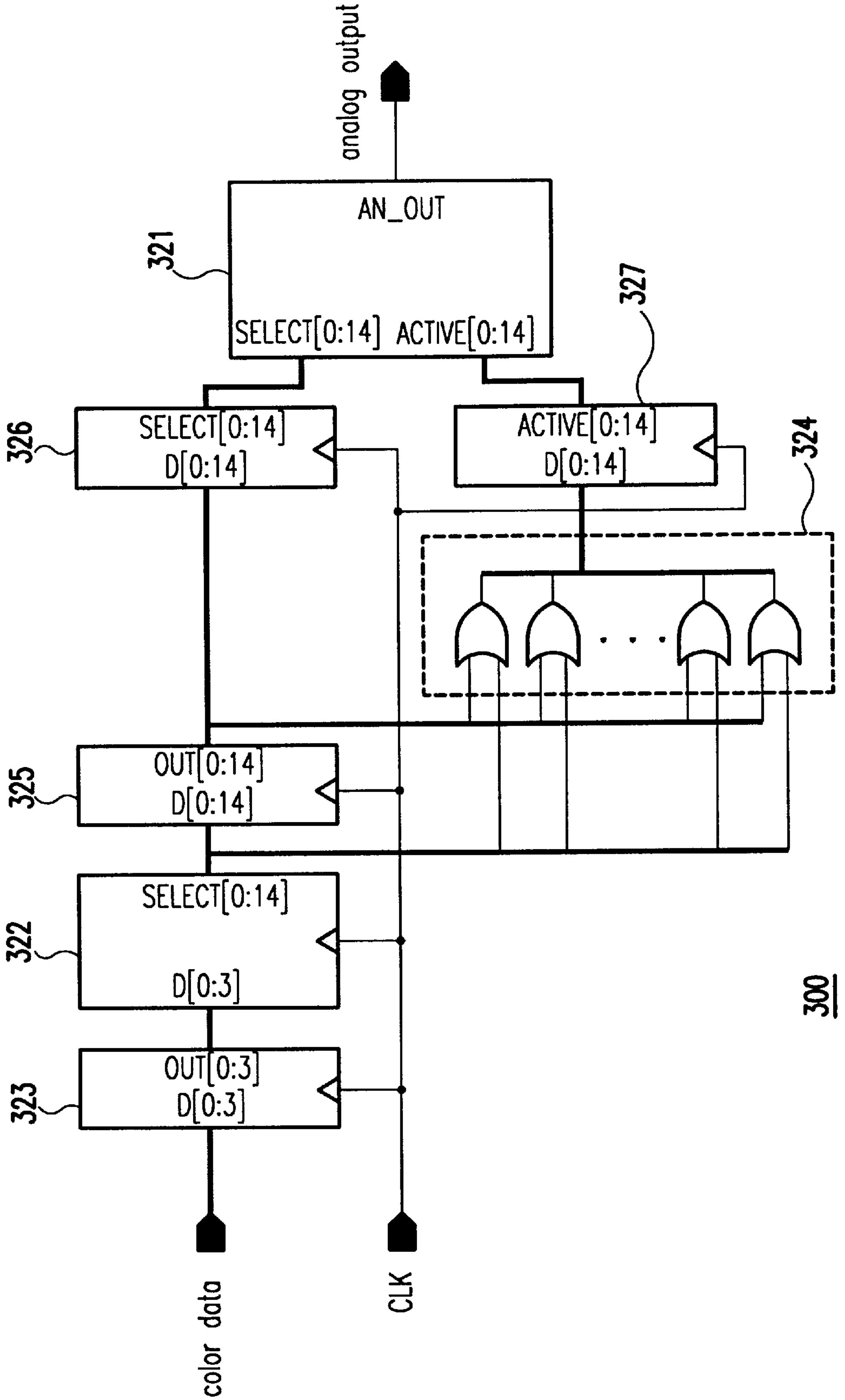
FIG. 5 is a circuit diagram illustrating a schematic structure of the D/A converter in a third embodiment of the present invention.
Figure 6:
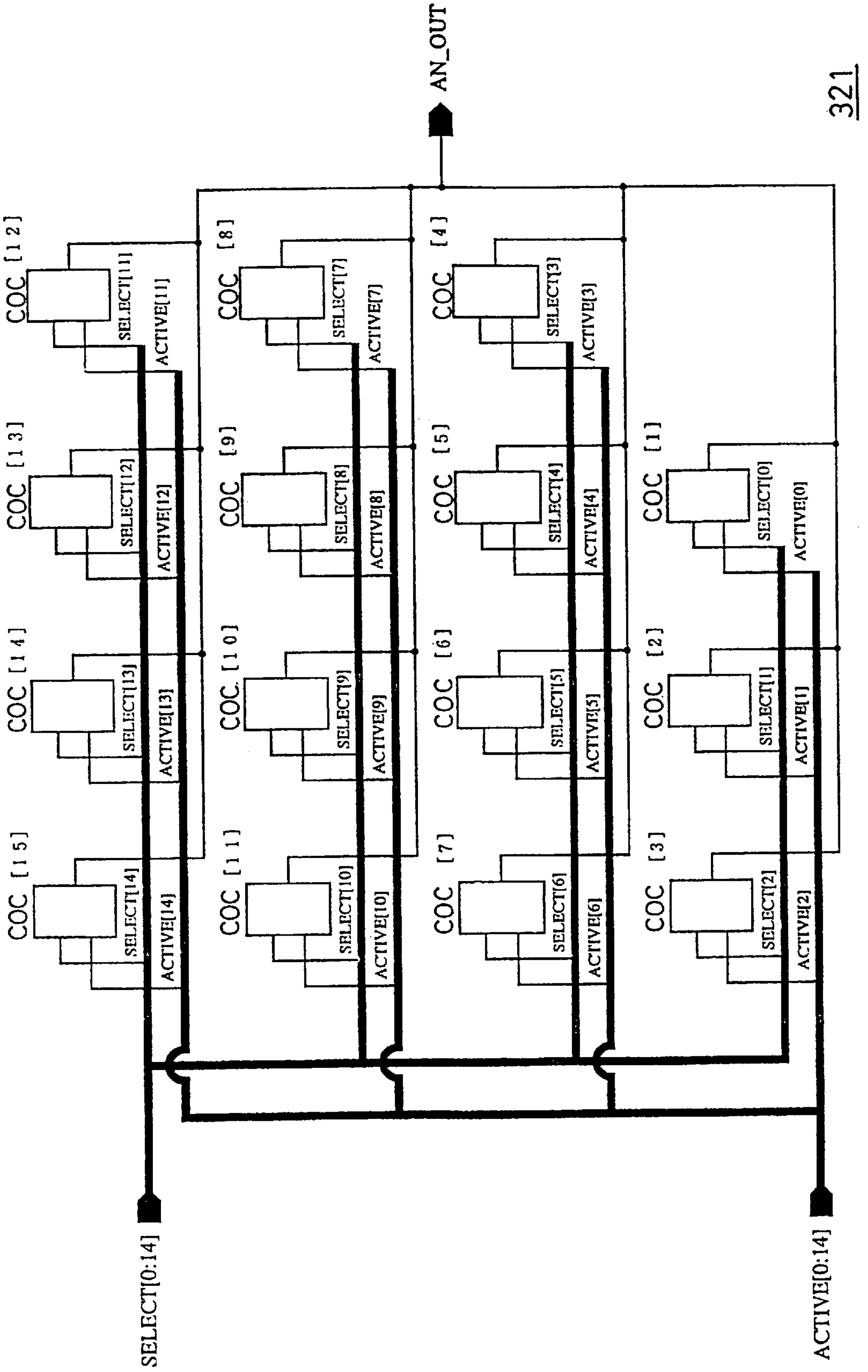
FIG. 6 is a circuit diagram illustrating a schematic structure of the current conversion circuit which may be adopted in the D/A converter in a third through sixth embodiment of the present invention.
Figure 7:
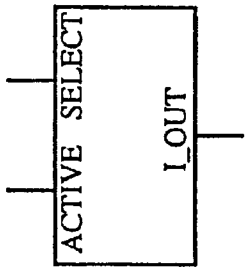
FIG. 7 illustrates the terminal structure at the current output circuits shown in FIG. 6.

Next, in reference to FIGS. 5 through 7, the structure and the operation of a D/A converter 300 in the third embodiment of the present invention are explained. It is to be noted that in reference to the third embodiment, an application of the present invention in a D/A converter with 4-bit resolution is explained.

As illustrated in FIG. 5, the D/A converter in the third embodiment of the present invention mainly comprises a current conversion circuit 321, a decoder 322, a data register 323, a bit adder circuit 324, a decode signal register 325, a first selection circuit 326 and a second selection circuit 327.

In the D/A converter 300 in the third embodiment shown in FIG. 5, 4-bit color data are input to the D [0:3] terminal of the data register 323 via a color data input terminal and the signal output from the OUT [0:3] terminal of the data register 323 is input to the D [0:3] terminal of the decoder 322. In addition, the decode signal output from the SELECT [0:14] terminal of the decoder 322 is input to the D [0:14] terminal of the decode signal register 325 and an input terminal of the bit adder circuit 324, whereas the signal output from the OUT [0:14] terminal of the decode signal register 325 is input to the D [0:14] terminal of the first selection circuit 326 and the other input terminal of the bit adder circuit 324. The signal output by the bit adder circuit 324 is input to the D [0:14] terminal of the second selection circuit 327. The signal output from the SELECT [0:14] terminal of the first selection circuit 326 is input to the SELECT [0:14] terminal of the current conversion circuit 321, the signal output from the ACTIVE [0:14] terminal of the second selection circuit 327 is input to the ACTIVE [0:14] terminal of the current conversion circuit 321 and the signal output from the AN_OUT terminal of the current conversion circuit 321 constitutes the output signal of the D/A converter.

In addition, a clock pulse is input via the CLK input terminal to the data register 323, the decoder 322, the decode signal register 325, the first selection circuit 326 and the second selection circuit 327.

An example of the current conversion circuit 321 which converts input color data to a current for output, is illustrated in FIG. 6. In the current conversion circuit 321, a specific number of current output circuits COC, e.g., 15 current output circuits COC, each of which outputs a constant current, as illustrated in FIG. 7, are provided, and current output circuits COC are selected by the SELECT signal from the first selection circuit 326 in a quantity corresponding to the input color data.

The total of the output currents from the current output circuits COC selected by the SELECT signal is output from the AN_OUT terminal of the current conversion circuit 321 to constitute the output signal of the D/A converter.

In addition, in the current conversion circuit 321, the operating/stopped states of the current output circuits COC are controlled with an ACTIVE signal from the second selection circuit 327, and the details of this control will be explained later. It is to be noted that the pin arrangement at the current output circuits COC in this embodiment having a SELECT terminal for receiving the SELECT signal from the first selection circuit 326, an ACTIVE terminal for receiving the ACTIVE signal from the second selection circuit 327 and an I_OUT terminal for output of the output current from the current source is shown in FIG. 7.

Figure 8:
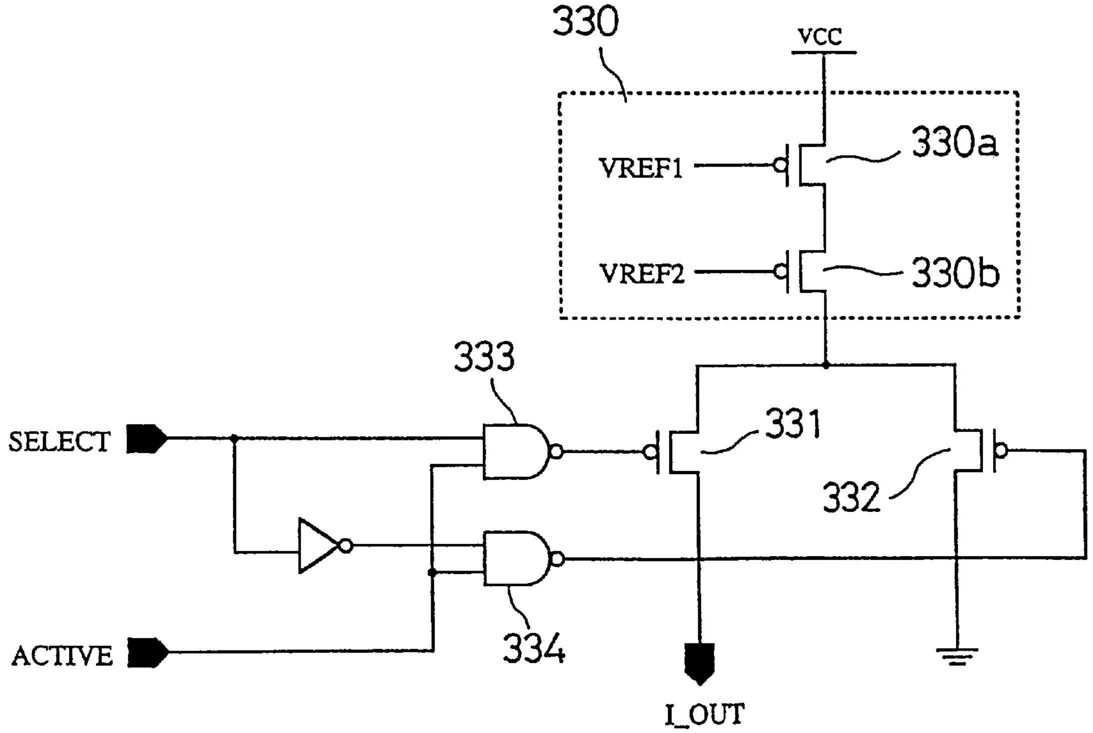
FIG. 8 is a circuit diagram illustrating an example of the current output circuits in FIG. 6.

FIG. 8 illustrates an example of such current output circuits COC. As shown in the figure, the current output circuit COC is provided with a current source 330 for outputting a constant current, constituted of a PMOS transistor 330*a* and a PMOS transistor 330*b*. The ACTIVE signal from the second selection circuit 327 is input through its ACTIVE terminal and the SELECT signal from the first selection circuit 326 is input through its SELECT terminal.

In this structure, when the ACTIVE signal is at low, the output signals of two-input NAND gates 333 and 334 are both set to high, thereby setting both of the switching elements (a PMOS transistor 331 and a PMOS transistor 332) in an off state to stop the operation of the current source 330.

In contrast, when the ACTIVE signal is at high, the operation is performed by controlling the switching elements based upon the SELECT signal to select whether the output current from the source 330 is to be output from the I_OUT terminal or be discharged to the ground. In other words, the operating/stopped state of the current source 330 is controlled based upon the ACTIVE signal from the second selection circuit 327, and if the current source 330 is in the operating state, the destination to which the output current from the current source 330 is to be output is switched based upon the SELECT signal from the first selection circuit 326.

In addition, the bit adder circuit 324 illustrated in FIG. 5 generates 15-bit data having the same bit length as that of the output signals from the decoder 322 and the decode signal register 325 by inputting the output signals from the decoder 322 and the decode signal register 325 and adding the common bits. By providing this bit adder circuit 324, it becomes possible to generate data that sets the operating state of the current source of a current output circuit COC, which is to be selected by the output signal from the first selection circuit 326 based upon next data (the output decode signal from the decoder 322) in addition to setting the operating state the current output circuits COC in the current conversion circuit 321 selected by the output signal from the first selection circuit 326 based upon the output signal from the decode signal register 325, as explained in detail later in reference to FIG. 9. In other words, in this embodiment, the current source of the current output circuit COC that is to be selected by the next set of data is set in the operating state in advance to standby for the input of the next set of data to the current conversion circuit 321.

It is to be noted that the second selection circuit 327 controls the operating/stopped states of the current sources 330 of the current output circuits COC in the current conversion circuit 321 based upon the output signal from the bit adder circuit 324 as explained earlier. The bit adder circuit 324 may be constituted of, for instance, 15 OR gates. In addition, the first selection circuit 326 and the second selection circuit 327 may be constituted of registers and, for instance, they may be achieved by adopting a circuit structure identical to that of the decode signal register 325.

Figure 9:
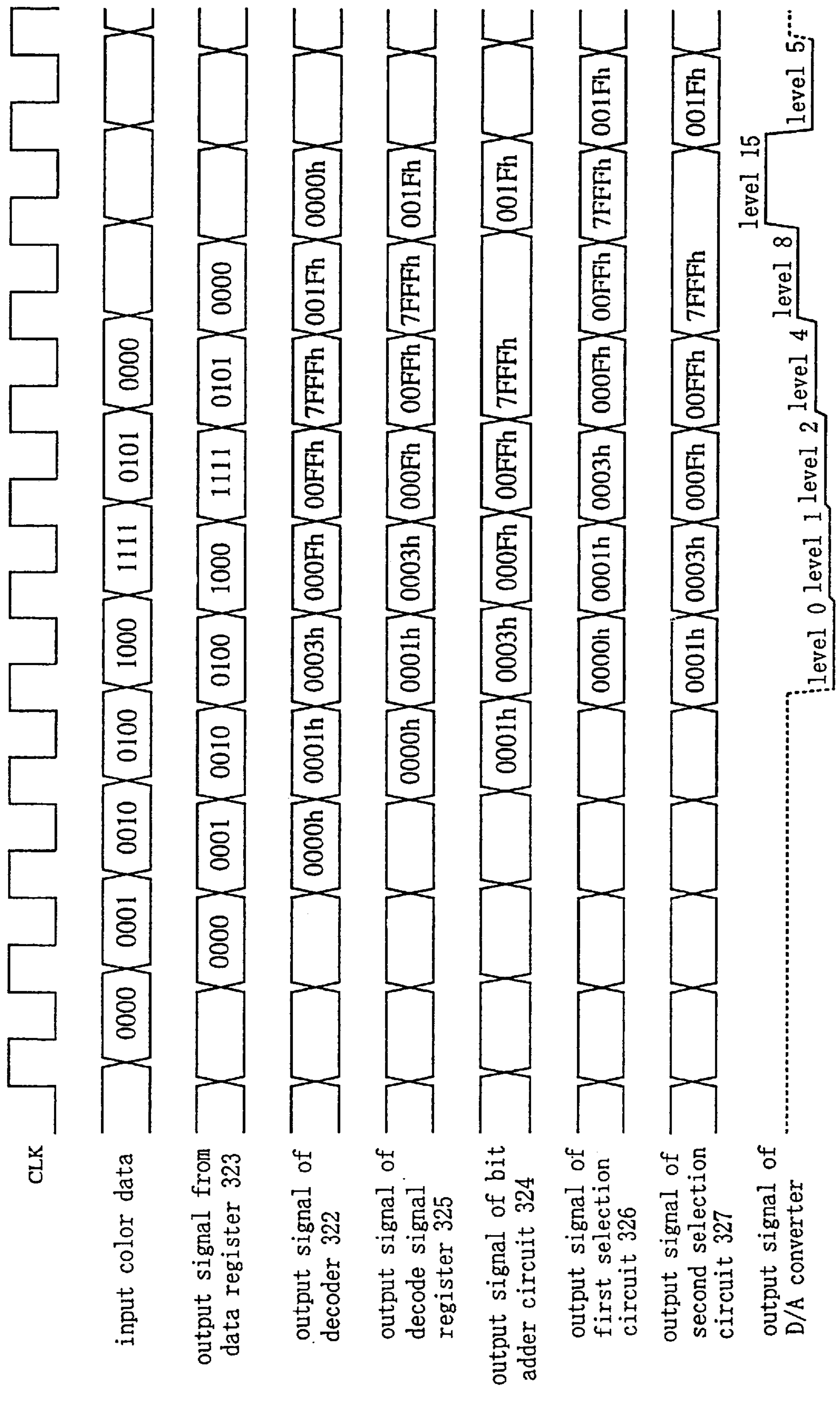
FIG. 9 is a timing chart illustrating the operation of the D/A converter in the third embodiment of the present invention.

Next, the operation of the D/A converter 300 illustrated in FIG. 5 is explained in reference to the timing chart in FIG. 9.

As shown in FIG. 9, when color data "0000" are input via the color data input terminal, the data register 323 holds the color data "0000" at the following rise of the CLK and outputs it to the decoder 322. Next, the decoder 322 outputs a SELECT signal for selecting the current output circuits COC in the current conversion circuit 321 based upon the color data output from the data register 323 at the following rise of the CLK, and if the color data are "0000," the signal output from the SELECT [0:14] terminal of the decoder 322 is "000 h."

Then, at the following rise of the CLK, the decode signal register 325 holds the signal "0000 h" output from the SELECT [0:14] terminal of the decoder 322 and outputs it to the first selection circuit 326 and the bit adder circuit 324. Likewise, when color data "0001" are input via the color data input terminal, the decoder 322 outputs a signal "0001 h" corresponding to the color data "0001" from the SELECT [0:14] terminal.

At this point, the output signal "0000 h" from the decode signal register 325 and the output signal "0001 h" from the decoder 322 which is to be input to the decode signal register 325 at the following rise of the CLK are input to the bit adder circuit 324 which, in turn, outputs a signal constituted of the OR of the common bits in the two signals ("0000 h") to the second selection circuit 327.

The first selection circuit 326 holds the signal "000 h" output from the decode signal register 325 and, at the following rise of the CLK, outputs the SELECT signal for selecting the current output circuits COC in the current conversion circuit 321 to the SELECT [0:14] terminal of the current conversion circuit 321 from the SELECT [0:14] terminal of the first selection circuit 326. In addition, the second selection circuit 327 holds the signal "10001 h" output from the bit adder circuit 324 and outputs the ACTIVE signal for controlling the operating states of the current sources 330 in the current output circuits COC to the ACTIVE [0:14] terminal of the current conversion circuit 321 from the ACTIVE [0:14] terminal of the second selection circuit 327.

Through the operation described above, the data "000 h" are sent to the SELECT [0:14] terminal of the current conversion terminal 321, with the result that none of the current output circuits COC in the current conversion circuit 321 shown in FIG. 6 are selected, thereby setting the level of the current output from the analog output terminal of the D/A converter to 0. However, since the data "0001 h" are input to the ACTIVE [0:14] terminal of the current conversion circuit 321, the current output circuit COC [1] enters the operating state.

In this state, at the following rise of the CLK, the data "0001 h" are input to the SELECT [0:14] terminal of the current conversion circuit 321 as shown in FIG. 9, resulting in the current output circuit COC [1] being selected, thereby setting the level of the current output from the analog output terminal to 1. In addition, since the data "0003 h" are input to the ACTIVE [0:14] terminal of the current conversion circuit 321, two current output circuits, i.e., the current output circuit COC [1] and the current output circuit COC [2], enter the operating state.

Now, to explain what happens when color data "1111" are input, a signal "7 FFFH," which corresponds to the color data "1111" is output by the decoder 322 from its SELECT [0:14] terminal. Then, the signal "7 FFFh" is output from the first selection circuit 326 to select all the current output circuits COC in the current conversion circuit 321, thereby setting the level of the current output from the analog output terminal of the D/A converter 300 to 15. However, in this embodiment, the signal "7 FFFh" is output by the second selection circuit 327 in advance of the output of the signal "7 FFFh" from the first selection circuit 326 by one clock pulse. As a result, all the current output circuits COC in the current conversion circuit 321 are set in the operating state.

As has been explained, in the D/A converter in this embodiment, since the bit adder circuit 324 that adds the common bits in the output signals from the decoder 322 and the decode signal register 325 and the second selection circuit 327 that controls the operating/stopped states of the current output circuits COC in the current conversion circuit 321 are provided, even when a current output circuit COC selected by the first selection circuit 326 in correspondence to the input color data is in the stopped state, the current output circuit COC can be switched into the operating state by the second selection circuit 327 one clock pulse ahead of the actual selection of the current output circuit COC by the first selection circuit 326 in correspondence to the input color data. Thus, the period of time required for the output current from the current output circuit COC to become stabilized is assured. In addition, the operation of the current output circuits COC that are not selected by the second selection circuit 327 are set in the stopped state, thereby making it possible to reduce the power consumption without degrading the characteristics of the D/A converter.

(Forth embodiment)

Figure 10:
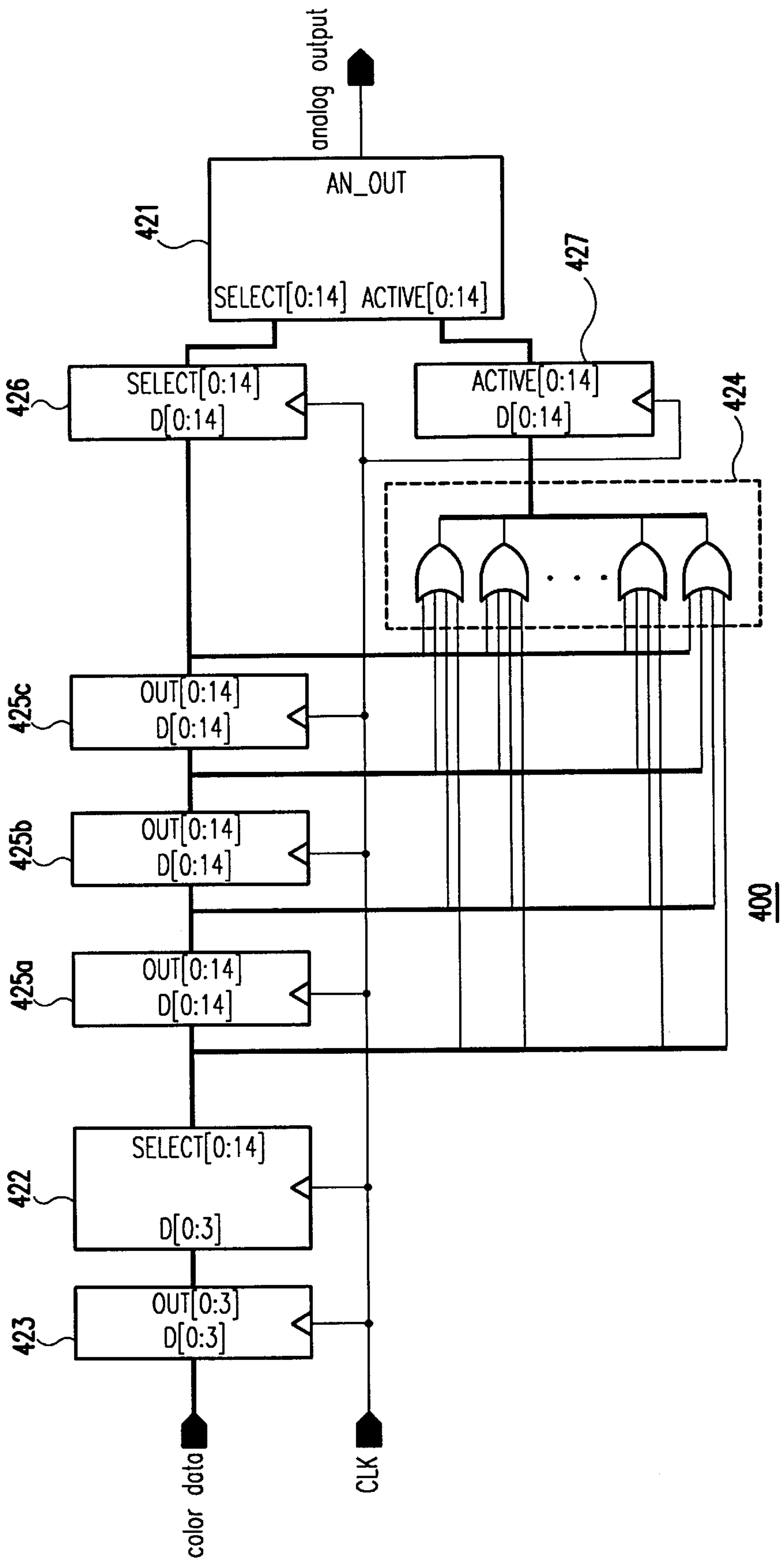
FIG. 10 is a circuit diagram illustrating a schematic structure of the D/A converter in the fourth embodiment of the present invention.
Figure 11:
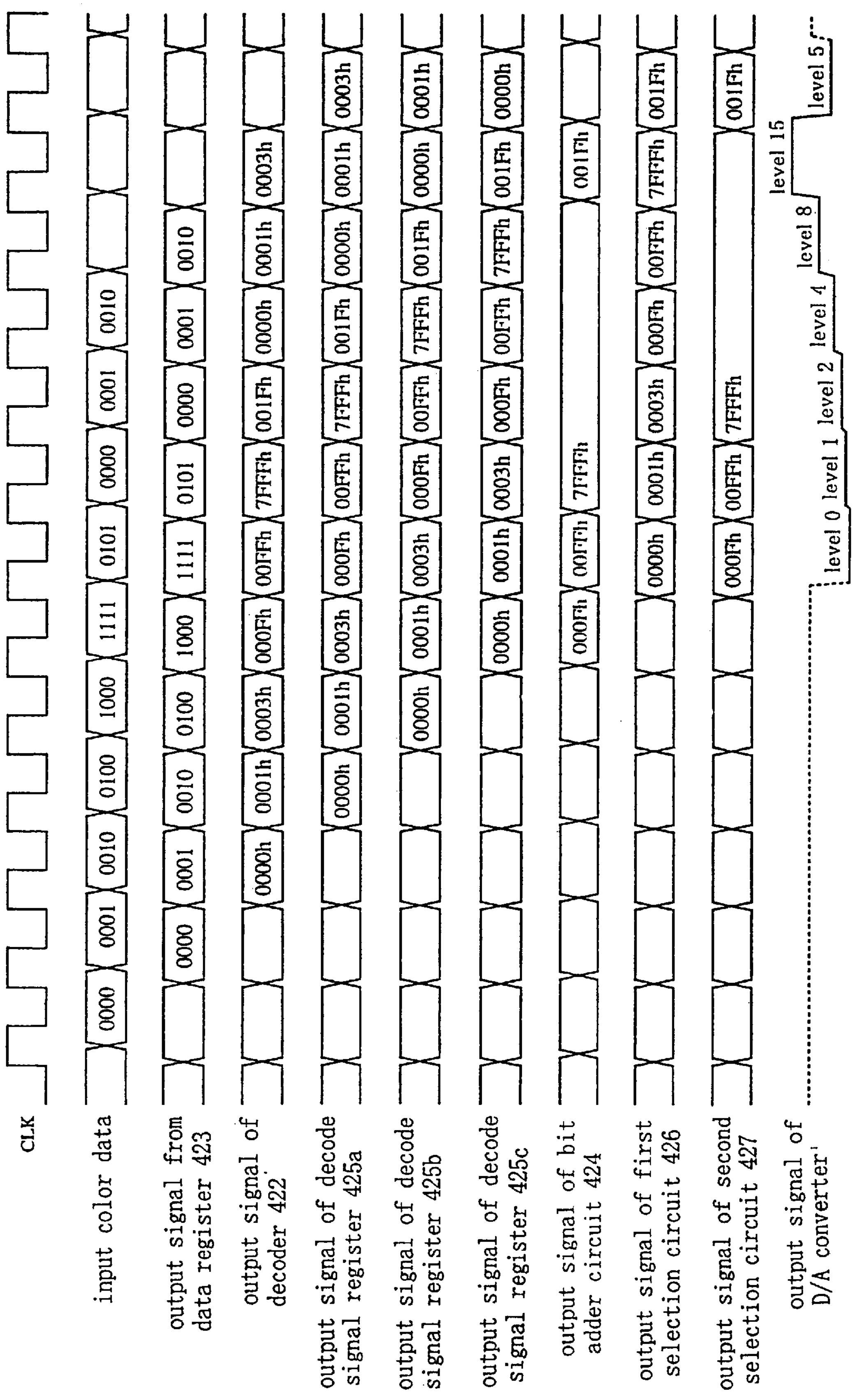
FIG. 11 is a timing chart illustrating the operation of the D/A converter in the fourth embodiment of the present invention.

Next, in reference to FIGS. 10 and 11, the structure and the operation of a D/A converter 400 in the forth embodiment of the present invention are explained.

In the D/A converter 300 in the third embodiment of the present invention, when the current source 330 of a current output circuit COC to be selected by the first selection circuit 326 in correspondence to the input color data is in the stopped state, a period of time corresponding to one clock pulse is allowed to elapse after the current source 330 is set in the operating state by the second selection circuit 327 before the current source 330 is actually selected by the first selection circuit 326. However, as the operating speed of the D/A converter becomes higher a period of time corresponding to one clock pulse may not be sufficient for the output current to stabilize even though the current source 330 has been switched from the stopped state to the operating state. For instance, if the period of time required for the output current from the current source 330 to become stable is 30 ns in a D/A converter operating frequency at 100 MHz, a period of time corresponding to three clock pulses will be required for the output current to stabilize.

In order to solve this problem, in the D/A converter 400 in the forth embodiment of the present invention, the decode signal registers 425 (425*a* through 425*c*) are provided over a plurality of stages, and the output signals of these decode signal registers 425*a* 425*c* are input to a bit adder circuit 424 where the common bits in the individual output signals are added. With this structure, it becomes possible to set only the current sources (not shown) of the current output circuits COC selected by a first selection circuit 426 in correspondence to the output signals from the decode signal registers 425*a* through 425*c* in the operating state and to allow a period of time corresponding to a plurality of clock pulses after a current source is set in the operating state by a second selection circuit 427 before it is actually selected by the first selection circuit 426.

The following is an explanation of the structure of the D/A converter 400 in the forth embodiment of the present invention in reference to FIG. 10.

In the D/A converter 400 in the forth embodiment shown in FIG. 10, 4-bit color data which are coming in through a color data input terminal are input to the D [0:3] terminal of a data register 423 via a color data input terminal, and the signal output from the OUT [0:3] terminal of the data register 423 is input to the D [0:3] terminal of a decoder 422. In addition, a decode signal output from the SELECT [0:14] terminal of the decoder 422 is input to the D [0:14] terminal of the decode signal register 425*a* and an input terminal of the bit adder circuit 424, the signal output from the OUT [0:14] terminal of the decode signal register 425*a* is input to the D [0:14] terminal of the decode signal register 425*b* and the input terminal of the bit adder circuit 424, the signal output from the OUT [0:14] terminal of the decode signal register 425*b* is input to the D [0:14] terminal of the decode signal register 425*c* and the input terminal of the bit adder circuit 424, and the signal output from the OUT [0:14] terminal of the decode signal register 425*c* is input to the D [0:14] terminal of the first selection circuit 426 and the input terminal of the bit adder circuit 424.

In addition, the signal output from the bit adder circuit 424 is input to the D [0:14] terminal of the second selection circuit 427. The signal output from the SELECT [0:14] terminal of the first selection circuit 426 is input to the SELECT [0:14] terminal of a current conversion circuit 421, the signal output from the ACTIVE [0:14] terminal of the second selection circuit 427 is input to the ACTIVE [0:14] terminal of the current conversion circuit 421 and the signal output from the AN_OUT terminal of the current conversion circuit 421 constitutes the output signal of the D/A converter 400.

Moreover, a clock pulse from a CLK input terminal is input via a CLK input terminal to the data register 423, the decoder 422, the decode signal registers 425*a*, 425*b* and 425*c*, the first selection circuit 426 and the second selection circuit 427, respectively.

Next, in reference to the timing chart presented in FIG. 11, the operation of the D/A converter 400 in the forth embodiment illustrated in FIG. 10 is explained. It is to be noted that since the operation performed up to the point at which the SELECT signal is output from the decoder 422 after color data are input via the color data input terminal is essentially identical to that performed in the D/A converter 300 in the third embodiment of the present invention, which has already been explained in reference to FIG. 9, its explanation is omitted.

As shown in FIG. 11, when a signal "0000 h" is output from the SELECT [0:14] terminal of the decoder 422 at the rise of the CLK, the decode signal register 425*a* holds the signal "0000 h" output from the SELECT [0:14] terminal of the decoder 422 and outputs it to the decode signal register 425*b* and the bit adder circuit 424 at the following rise of the CLK. In addition, the next signal, i.e., the signal "0001 h," is output from the decoder 422.

Likewise, the decode signal register 425*a* holds the signal "0001 h" output from the decoder 422 and, at the following rise of the CLK, outputs it to the decode signal register 425*b* and the bit adder circuit 424. At the same time, the decode signal register 425*b* holds the signal "0000 h" output from the decode signal register 425*a* before the rise of the CLK and outputs it to the decode signal register 425*c* and the bit adder circuit 424, and the next signal, i.e., the signal "0003 h," is output from the decoder 422.

Then, again, at the following rise of the CLK, the decode signal register 425*a* outputs the signal "0003 h" to the decode signal register 425*b* and the bit adder circuit 424, the decode signal register 425*b* outputs the signal "0001 h" to the decode signal register 425*c* and the bit adder circuit 424, the decode signal register 425*c* outputs the signal "0000 h" to the first selection circuit 426 and the bit adder circuit 424 and the next signal, i.e., the signal "000 Fh," is output from the decoder 422.

Through this operation, the output signals from the decoder 422 and the decode signal registers 425*a*, 425*b* and 425*c* are input to the bit adder circuit 424, which then outputs a signal ("000 Fh") constituted of the OR of the common bits in the four signals to the second selection circuit 427.

Next, the first selection circuit 426 holds the signal "0000 h" output from the decode signal register 425*c* and, at the following rise of the CLK, outputs the SELECT signal for selecting the current output circuits COC in the current conversion circuit 421 to the SELECT [0:14] terminal of the current conversion circuit 421 from the SELECT [0:14] terminal of the first selection circuit 426. Concurrently with this, the second selection circuit 427 holds the signal "000 Fh" output from the bit adder circuit 424 and outputs the ACTIVE signal for controlling the operating state of the current sources in the current output circuits COC to the ACTIVE [0:14] terminal of the current conversion circuit 421 from the ACTIVE [0:14] terminal of the second selection circuit 427.

Since the data "0000 h" are input to the SELECT [0:14] terminal of the current conversion circuit 421 through this operation, none of the current output circuits COC in the current conversion circuit 421 are selected, thereby setting the level of the current output from the analog output terminal of the D/A converter 400 to 0. In addition, since the data "000 Fh" are input to the ACTIVE [0:14] terminal of the current conversion circuit 421 at the same time, the current output circuits COC [1] through [4] enter the operating state. It is to be noted that since any persons skilled in the art should be able to deduce what occurs in the subsequent operation illustrated in FIG. 11 easily by referring to the explanation given above, a detailed explanation thereof is omitted here.

Now, as for the operation performed when color data "1111" are input, when the color data "1111" are input, a signal "7 FFFh" that corresponds to the color data "1111" is output by the decoder 422 from its SELECT [0:14] terminal, all the current output circuits COC in the current conversion circuit 421 are selected by outputting the signal "7 FFFh" from the first selection circuit 426 and thus, the level of the current output from the analog output terminal of the D/A converter 400 is set to 15 through the procedure explained earlier. However, since, in this embodiment, the signal "7 FFFh" is output from the second selection circuit 427 at a point in time three clock pulses in advance of the output of the signal "7FFFh" by the first selection circuit 426 to set all the current output circuits COC in the current conversion circuit 421 in the operating state, a stable current output is achieved.

As has been explained, in the D/A converter 400 in the forth embodiment of the present invention, which is provided with the decode signal registers 425 (425*a* through 425*c*) over a plurality of stages, the period of time required for the output current to stabilize when switching the current output circuits COC from the stopped state to the operating state can be assured with ease. In addition, when the operating frequency of the D/A converter becomes even higher, it is possible to secure the period of time required for the output current from the current output circuits COC to become stable by increasing the number of decode signal registers without having to modify the structure of the current conversion circuit 421. Thus, an increase in the power consumption can be prevented without resulting in degradation of the characteristics of the D/A converter 400 so that a highly versatile D/A converter can be provided. In addition, the D/A converter 400 in this embodiment is particularly advantageous if utilized in a case in which the same color data are likely to be continuous, as in text-based application software including, for instance, text preparation and table calculation in which the possibility of pixels in the same color lying adjacent to one another is high.

(Fifth embodiment)

Figure 12:
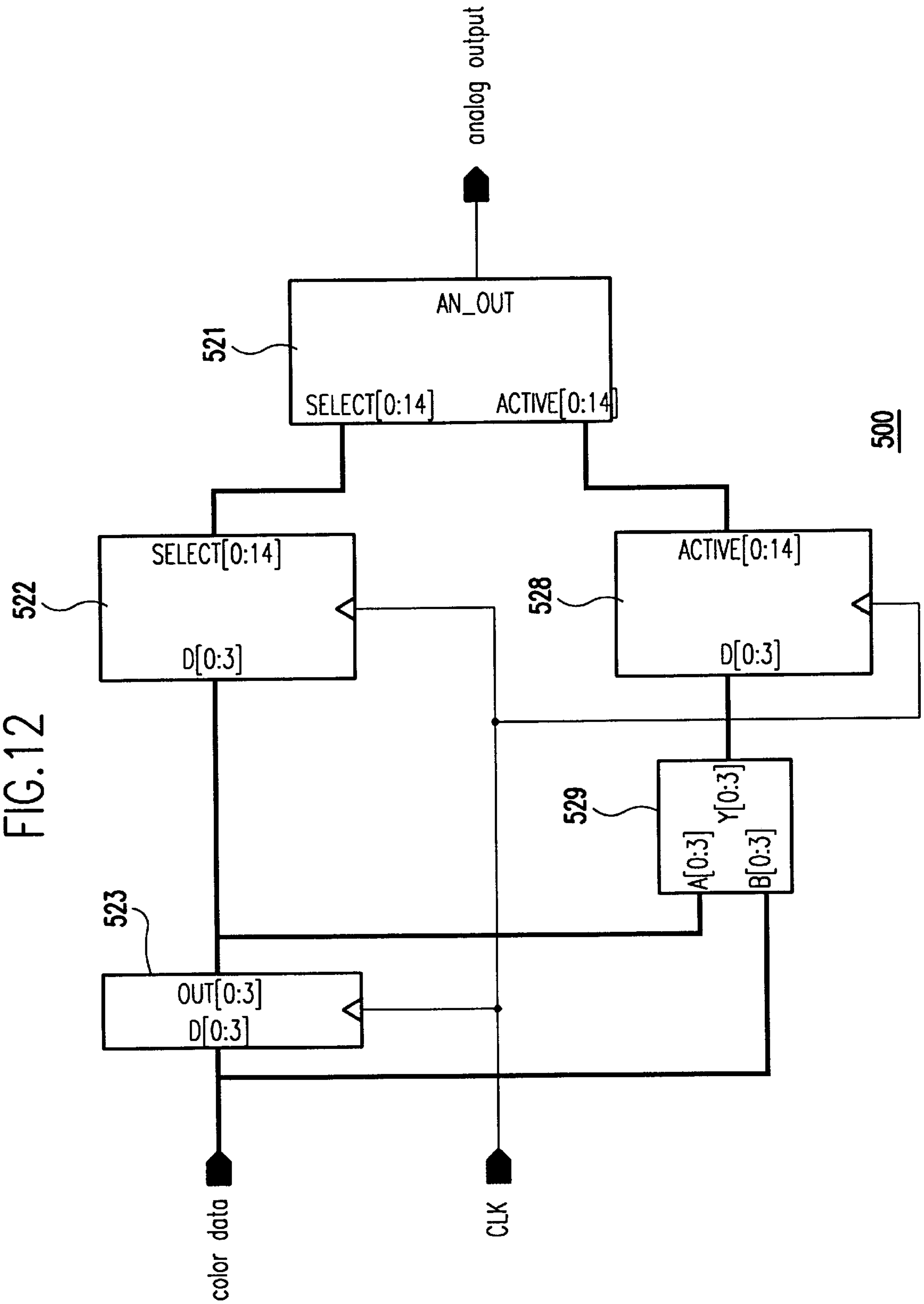
FIG. 12 is a circuit diagram illustrating a schematic structure of the D/A converter in the fifth embodiment of the present invention.
Figure 13:
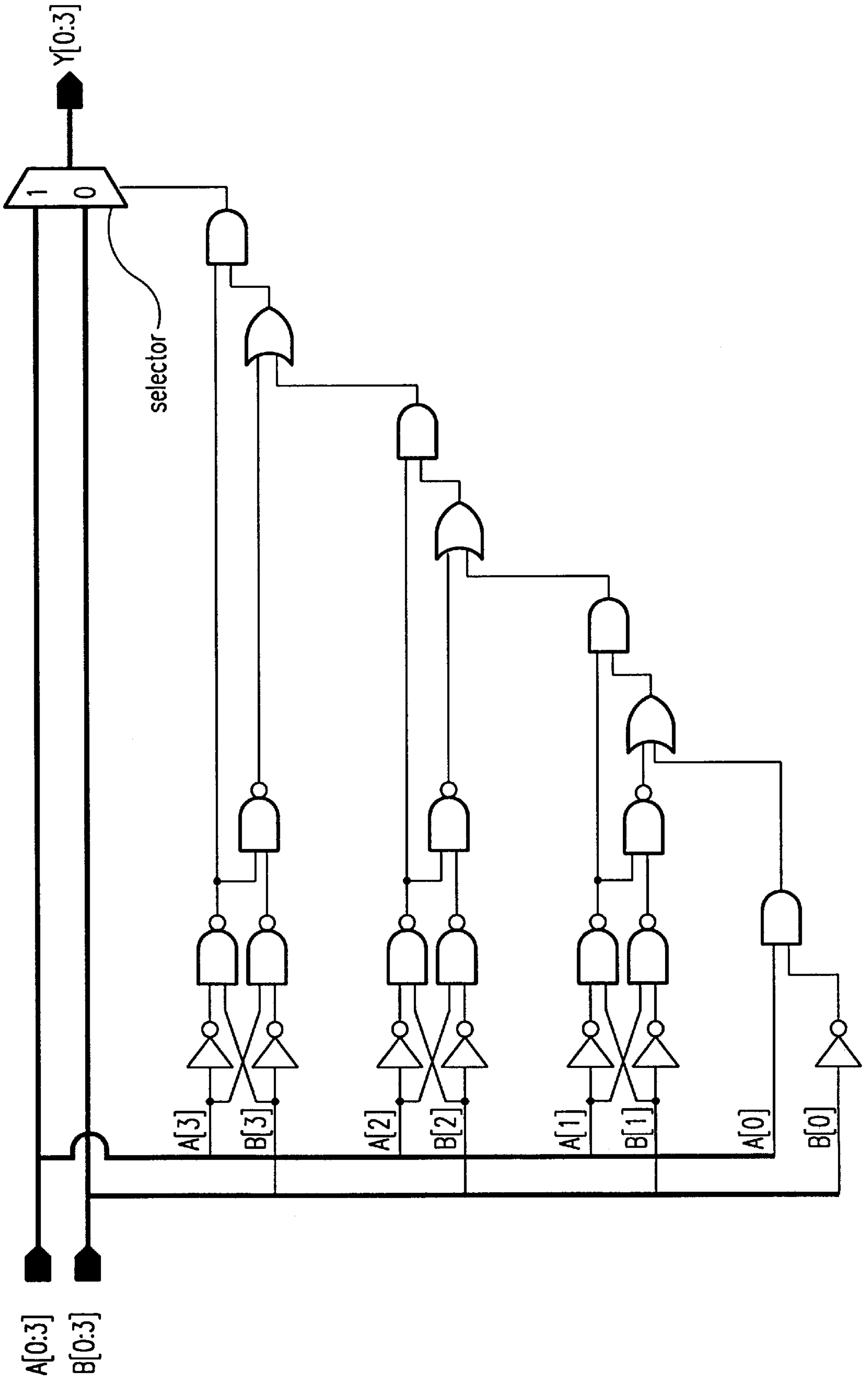
FIG. 13 is a circuit diagram illustrating an example of the data selection circuit which may be adopted in the D/A converter in the fifth and sixth embodiments of the present invention.

Next, in reference to FIGS. 12 and 13, a D/A converter 500 in the fifth embodiment of the present invention is explained in detail.

In the D/A converters 300 and 400 in the third and forth embodiments respectively, the decode signal registers 325 and 425 for holding the decode signals from the decoders 322 and 422, the bit calculating adder 324 and 424 for adding up the common bits in the output signals from the decoders 322 and 422 and the decode signal registers 325 and 425, the first selection circuits 326 and 426 that select the current output circuits COC in the current conversion circuits 321 and 421 that will output currents from their output terminals and the second selection circuits 327 and 427 for controlling the operating/stopped states of the current output circuits COC in the current conversion circuits 321 and 421 are provided. While the number of the current output circuits COC in the current conversion circuits 321 and 421 increases as the resolution of the D/A converter increases, the number of bits in the decode signals from the decoders 322 and 422 increases as the number of the current output circuits COC increases. When the resolution of the D/A converter increases, the number of bits in the decode signals from the decoders 322 and 422 increases to a greater extent than the extent to which the number of bits in the input color data increases. Because of this, the circuit scales of the decode signal registers 325 and 425, the bit calculating adder 324 and 424, the first selection circuits 326 and 426 and the second selection circuits 327 and 427 may become large.

Thus, in the D/A converter 500 in the fifth embodiment of the present invention, two decoders, i.e., a first decoder 522 and a second decoder 528 are provided instead of providing the SELECT signal and the ACTIVE signal to the current conversion circuit in conformance to the decode signal from one decoder, with the SELECT signal provided by the first decoder 522 and the ACTIVE signal provided by the other decoder 528 in correspondence to the input color data.

FIG. 12 is a circuit diagram illustrating a schematic structure of the D/A converter 500 in the fifth embodiment. The following is an explanation of the D/A converter 500 shown in FIG. 12 which is a D/A converter with 4-bit resolution, as in the case of the D/A converters 300 and 400 in the third and forth embodiments of the present invention.

As illustrated in FIG. 12, 4-bit color data are input to the D [0:3] terminal of a data register 523 and the B [0:3] terminal of a data selection circuit 529 from the color data input terminal. In addition, the signal output from the OUT [0:3] terminal of the data register 523 is input to the D [0:3] terminal of the first decoder 522 and the A [0:3] terminal of the data selection circuit 529. The signal output from the Y [0:3] terminal of the data selection circuit 529 is input to the D [0:3] terminal of the second decoder 528.

Moreover, the decode signal output from the SELECT [0:14] terminal of the first decoder 522 is input to the SELECT [0:14] terminal of a current conversion circuit 521, whereas the decode signal output from the ACTIVE [0:14] terminal of the second decoder 528 is input to the ACTIVE [0:14] terminal of the current conversion circuit 521, and the signal output from the AN_OUT terminal of the current conversion circuit 521 constitutes the output signal of the D/A converter 500.

In the D/A converter 500 in the fifth embodiment of the present invention, the operating/stopped states of the current sources are controlled based upon the ACTIVE signal provided by the second decoder 528, unlike in the D/A converters 300 and 400 in the third and forth embodiments of the present invention, and if a current source is in the operating state, the destination of the output of the output current from the current source is switched in conformance to the SELECT signal provided by the first decoder 522. In addition, a clock pulse is input to the data register 523, the first decoder 522 and the second decoder 528 via the CLK input terminal.

In this configuration, the input color data and the output signal of the data register 523 are input to the data selection circuit 529 where the sizes of the two signals are compared and the data corresponding to the higher-order signal are output. With this, the data that sets only the current sources at the current output circuits COC selected by the first decoder 522 in the operating state can be generated in correspondence to the higher-order data of the output signal from the data register 523 and the next color data (color data input via the input terminal). As explained earlier, the second decoder 528 controls the operating/stopped state of the current sources of the current output circuits COC in the current conversion circuit 521 in correspondence to the output signal from the data selection circuit 529. It is to be noted that in FIG. 13, a circuit diagram illustrating an example of the data selection circuit 529 is presented and a table of its true values is presented in FIG. 14. In addition, the first decoder 522 and the second decoder 528 may be constituted of identical circuits.

Figure 15:
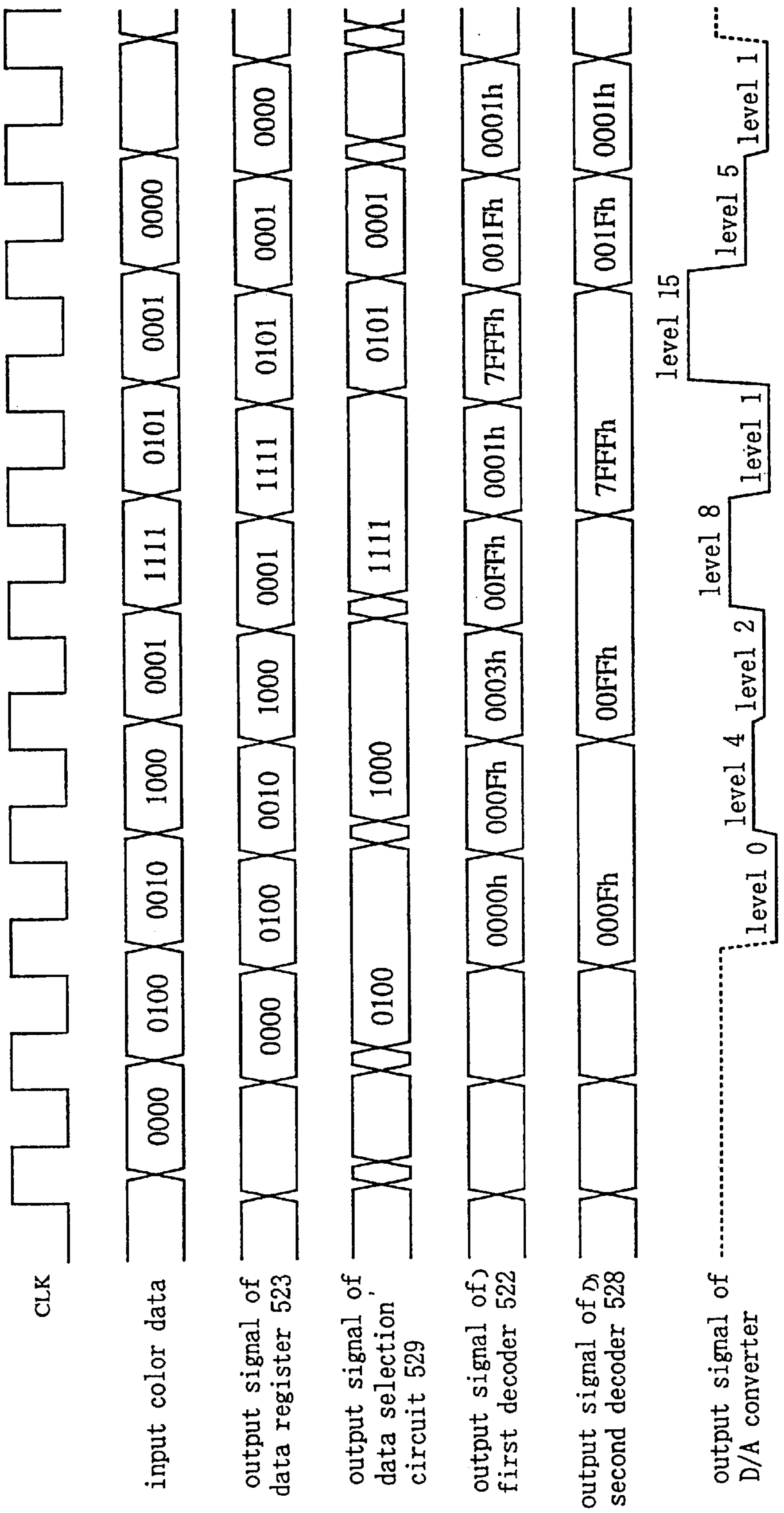
FIG. 15 is a timing chart illustrating the operation of the D/A converter in the fifth embodiment of the present invention.

Next, in reference to the timing chart in FIG. 15, the operation of the D/A converter in the fifth embodiment of the present invention is explained.

As shown in FIG. 15, when color data "0000" are input via the color data input terminal, the data register 523 holds the color data "0000" and outputs it to the first decoder 522 and the data selection circuit 529 at the following rise of the CLK. In addition, when the next color data "0100" are input via the input terminal, the data selection circuit 529 compares the sizes of the output signal of the data register 523 and the input color data, and outputs the higher-order data "0100" to the second decoder 528.

While the first decoder 522 outputs the SELECT signal for selecting the current output circuit COC in the current conversion circuit 521 to the current conversion circuit 521 at the following rise of the CLK, if the output signal of the data register 523 is "0000", the signal that is output from the SELECT [0:14] terminal of the first decoder 522 to the SELECT [0:14] terminal of the current conversion circuit 521 is "0000 h." At the same time, the second decoder 528 outputs the ACTIVE signal for controlling the operating state of the current sources in the current output circuits COC to the current conversion circuit 521, and if the output signal of the data selection circuit 529 is "0100," the signal output from the ACTIVE [0:14] terminal of the second decoder 528 to the ACTIVE [0:14] terminal of the current conversion circuit 521 is "000 Fh."

Thus, since the data "0000 h" are input to the SELECT [0:14] terminal of the current conversion circuit 521, none of the current output circuits COC in the current conversion circuit 521 are selected, thereby setting the level of the current output from the analog output terminal of the D/A converter 500 to 0. In addition, since the data "000 Fh" are input to the ACTIVE [0:14] terminal of the current conversion circuit 521, the current output circuits COC [1] through [4] enter the operating state. Moreover, in a procedure similar to that described above, when the output signal from the data register 523 is "0100" and the color data input via the color data input terminal are set to "0010," the signal output from the data selection circuit 529 is "0100" and the signal output from the first decoder 522 and the signal output from the second decoder 528 at the following rise of the CLK are set to "000 Fh" and "000 Fh," thereby selecting the current output circuits COC [1] through [4] to set the level of the current output from the analog output terminal to 4, with the current output circuits COC [1] through [4] in the operating state.

Likewise, when the output signal from the data register 523 is "0010" and the color data input via the color data input terminal are set to "1000," the signal output from the data selection circuit 529 is "1000" and the signal output from the first decoder 522 and the signal output from the second decoder 528 at the following rise of the CLK are set to "0003 h" and "000 FFh" respectively, thereby selecting two current output circuits COC, i.e., the current output circuits COC [1] and [2] to set the level of the current output from the analog output terminal to 2, with the current output circuits COC [1] through [8] in the operating state. Since the subsequent operation can be deduced easily by persons skilled in the art by referring to FIG. 15, its detailed explanation is omitted.

Now, let us consider a situation in which the color data are set to "1111." When the color data "1111" are input, a signal "7 FFFh" that corresponds to the color data "1111" is output by the first decoder 522 from its SELECT [0:14] terminal through the procedure described earlier, and the level of the current output from the analog output terminal of the D/A converter 500 is set to 15. In this situation, with the signal "7 FFFh" output from the second decoder 528 one clock pulse in advance of the output of the signal "7 FFFh" by the first decoder 522, all the current output circuits COC in the current conversion circuit 521 are set in the operating state.

As has been explained, in the D/A converter 500 in the fifth embodiment provided with the data selection circuit 529 which, with the input color data and the output signal from the data register 523 input, compares the sizes of the two signals against each other to output the higher-order signal and the second decoder 528 which controls the operating/stopped states of the current output circuits COC in the current conversion circuit 521, even when a current output circuit COC which is to be selected by the first decoder 522 in correspondence to the input color data is in the stopped state, it can be switched to the operating state by the second decoder 528 one pulse ahead of the actual selection of the current output circuit COC that corresponds to the input color data by the first decoder 522, thereby securing a sufficient period of time to elapse before the output current from the current output circuit COC becomes stabilized. In addition, since the current output circuits COC that are not selected by the second decoder 528 can be set in the stopped state, the power consumption can be reduced without degrading the characteristics of the D/A converter 500 as in the case with the D/A converter 300 in the third embodiment of the present invention.

Moreover, in the D/A converter 500 in the fifth embodiment of the present invention, the period of the cycle starting at the input of color data and ending at the output of an analog signal can be reduced compared to that in the D/A converter 300 in the third embodiment.

Furthermore, while, in the D/A converter 500 in the fifth embodiment of the present invention, the circuit scales of the decode signal register 325, the bit calculating adder 324, the first selection circuit 326 and the second selection circuit 327 become greater in the D/A converter in the third embodiment according to the present invention when the resolution of the D/A converter increases, since the number of bits in the decode signal from the first decoder 522 increases to a larger extent than the extent to which the number of bits in the input color data increases, as explained earlier, modification only needs to be made to achieve the data selection circuit 529 and the second decoder 528 that are capable of performing the processing at the number of bits that are the same as the resolution of the D/A converter 500, thereby making it possible to limit the increase in the circuit scales compared to that required in the D/A converter 300 in the third embodiment of the present invention.

(Sixth embodiment)

Figure 16:
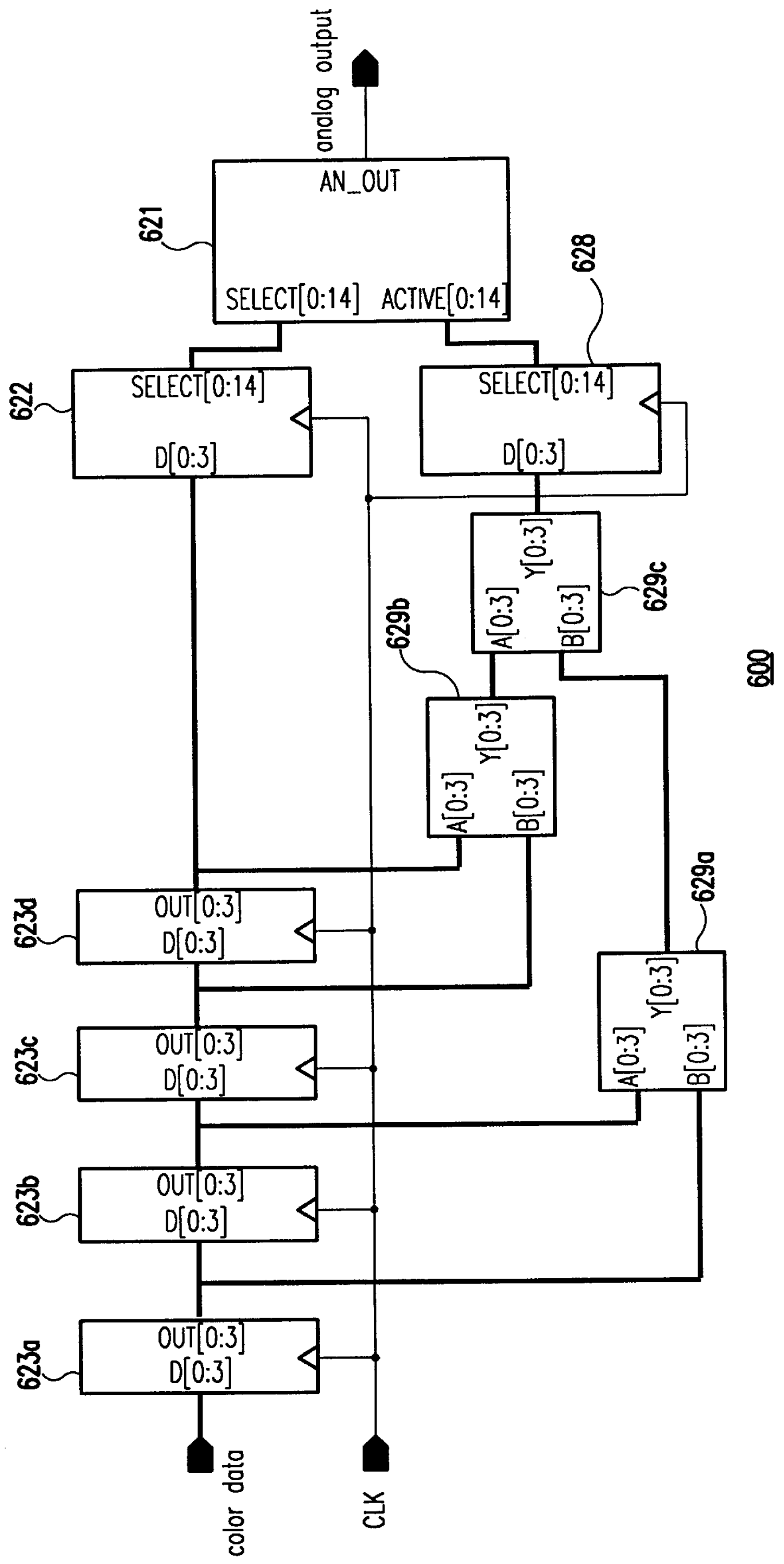
FIG. 16 is a circuit diagram illustrating a schematic structure of the D/A converter in the sixth embodiment of the present invention.
Figure 17:
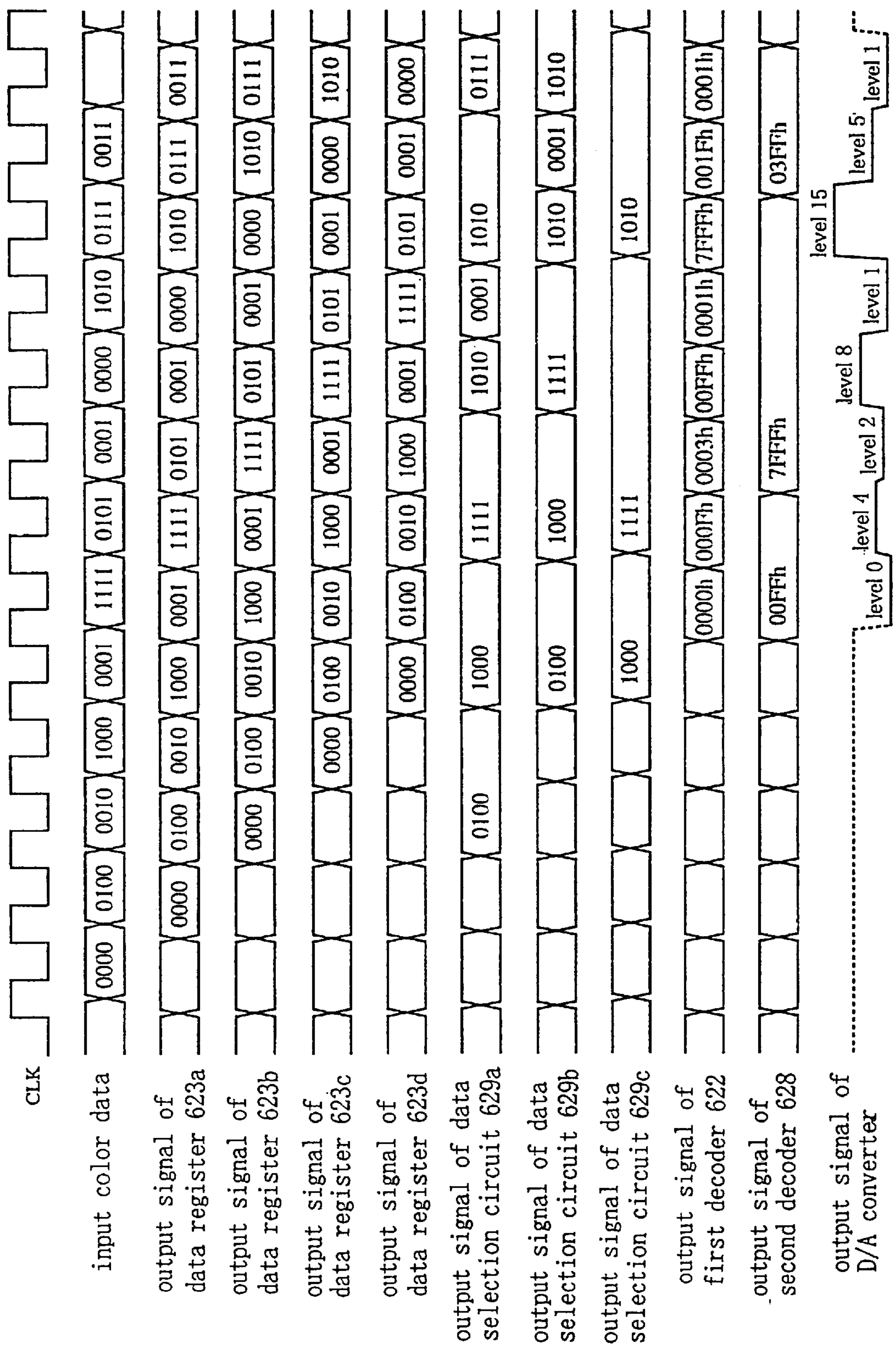
FIG. 17 is a timing chart illustrating the operation of the D/A converter in the sixth embodiment of the present invention.

Next, in reference to FIGS. 16 and 17, the structure and the operation of a D/A converter in the sixth embodiment of the present invention are explained.

In the D/A converter 500 in the fifth embodiment of the present invention, when the current source of a current output circuit COC that is to be selected by the first decoder 522 in correspondence to the input color data is in the stopped state, the current source is set in the operating state by the second decoder 528 and then a period of time corresponding to one clock pulse is allowed to elapse before the first decoder 522 actually makes the selection, as in the case of the D/A converter 300 in the third embodiment of the present invention. However, as D/A converters become faster, there may be situations in which allowing a period of time corresponding to only one clock pulse for the output current to stabilize may not be sufficient when switching the current source from the stopped state to the operating state.

In the D/A converter 600 in the sixth embodiment of the present invention, which is provided with data registers 623 over a plurality of stages and a data selection circuit 629 that selects the highest-order data among the output signals from the individual data registers, only the current sources of current output circuits COC that are to be selected by a first decoder 622 in correspondence to the highest-order data will be set in the operating state by a second decoder 628, and a period of time that corresponds to a plurality of clock pulses can be allowed to elapse after the current source is set in the operating state by the second decoder 628 before they are actually selected by the first decoder 622.

FIG. 16 illustrates a schematic structure of the D/A converter 600 in the sixth embodiment of the present invention. As shown in FIG. 16, 4-bit color data are input to the D [0:3] terminal of a data register 623*a* via the color data input terminal. The signal output from the OUT [0:3] terminal of the data register 623*a* is input to the D [0:3] terminal of a data register 623*b* and the B [0:3] terminal of a data selection circuit 629*a*. The signal output from the OUT [0:3] terminal of the data register 623*b* is input to the D [0:3] terminal of a data register 623*c* and the A [0:3] terminal of the data selection circuit 629*a*. The signal output from the OUT [0:3] terminal of the data register 623*c* is input to the D [0:3] terminal of a data register 623*d* and the B [0:3] terminal of a data selection circuit 629*b*. The signal output from the OUT [0:3] terminal of the data register 623*d* is input to the D [0:3] terminal of the decoder 622 and the A [0:3] terminal of the data selection circuit 629*b*.

Furthermore, the signal output from the Y [0:3] terminal of the data selection circuit 629*a* is input to the B [0:3] terminal of a data selection circuit 629*c*, the signal output from the Y [0:3] terminal of the data selection circuit 629*b* is input to the A [0:3] terminal of the data selection circuit 629*c* and the signal output from the Y [0:3] terminal of the data selection circuit 629*c* is input to the D [0:3] terminal of the second decoder 628.

The decode signal output from the SELECT [0:14] terminal of the first decoder 622 is input to the SELECT [0:14] terminal of a current conversion circuit 621, the decode signal output from the ACTIVE [0:14] terminal of the second decoder 628 is input to the ACTIVE [0:14] terminal of the current conversion circuit 621 and the signal output from the AN_OUT terminal of the current conversion circuit 621 constitutes the output signal of the D/A converter 600. In addition, a clock pulse is input to the data register 623*a*, 623*b*, 623*c* and 623*d*, the first decoder 622 and the second decoder 628 via the CLK input terminal.

Next, in reference to the timing chart presented in FIG. 17, the operation of the D/A converter in the sixth embodiment of the present invention is explained.

As shown in FIG. 17, when color data "0000" are input via the color data input terminal, the data register 623*a* holds the color data "0000" and outputs them to the data register 623*b* and the data selection circuit 629*a* at the following rise of the CLK. Likewise, when next color data "0100" are input via the color data input terminal, the data register 623*a* holds the color data "0100" and output them to the data register 623*b* and the data selection circuit 629*a* at the following rise of the CLK and, at the same time, the data register 623*b* holds the signal "0000" output from the data register 623*a* prior to the rise of the CLK and outputs it to the data register 623*c* and the data selection circuit 629*a*.

In the same manner, when next color data "0010" are input, the data register 623*a* outputs the signal "0010" to the data register 623*b* and the data selection circuit 629*a*, the data register 623*b* outputs a signal "0100" to the data register 623*c* and the data selection circuit 629*a* and the data register 623*c* outputs the signal "0000" to the data register 623*d* and the data selection circuit 629*b* at the following rise of the CLK.

Likewise, when next color data "1000" are input, the data register 623*a* outputs the signal "1000" to the data register 623*b* and the data selection circuit 629*a*, the data register 623*b* outputs a signal "0010" to the data register 623*c* and the data selection circuit 629*a*, the data register 623*c* outputs the signal "0100" to the data register 623*d* and the data selection circuit 629*b*, and the data register 623*d* outputs the signal "0000" to the first decoder 622 and the data selection circuit 629*b* at the following rise of the CLK. In this state, the output signal "1000" of the data register 623*a* and the output signal "0010" of the data register 623*b* are input to the data selection circuit 629*a*, so that the higher-order signal "1000" of the two signals is output to the data selection circuit 629*c*, whereas the output signal "0100" of the data register 623*c* and the output signal "0000" of the data register 623*d* are input to the data selection circuit 629*b*, so that the higher-order signal "0100" of the two signals is output to the data selection circuit 629*c*.

Thus, the output signal "1000" from the data selection circuit 629*a* and the output signal "0100" from the data selection circuit 629*b* are input to the data selection circuit 629*c* which then outputs the higher-order signal "1000" of the two signals to the second decoder 628. At the following rise of the CLK, the first decoder 622 outputs the SELECT signal for selecting a current output circuit COC in the current conversion circuit 621 to the current conversion circuit 621, and if the output signal from the data register 623*d* is "0000," the signal output to the SELECT [0:14] terminal of the current conversion circuit 621 from the SELECT [0:14] terminal of the first decoder 622 will be "0000 h."

Concurrently with this, the second decoder 628 outputs the ACTIVE signal that controls the operating states of the current sources in the current output circuit COC to the current output circuit COC, and if the output signal from the data selection circuit 629*c* is "1000," the signal output from the ACTIVE [0:14] terminal of the second decoder 628 to the ACTIVE [0:14] terminal of the current conversion circuit 621 will be "00 FFh."

Through this operation, the data "0000 h" are input to the SELECT [0:14] terminal of the current conversion circuit 621, with the result that none of the current output circuits COC in the current conversion circuit 621 are selected, to set the level of the current output from the analog output terminal of the D/A converter 600 to 0.

In addition, since the data "00 FFh" are input to the ACTIVE [0:14] terminal of the current conversion circuit 621, the current output circuits COC [1] through [8] enter the operating state. When color data "0001" are input via the color data input terminal to set the output signals from the data registers 623*a*, 623*b*, 623*c* and 623*d* to "0001," "1000," "0010" and "0100" respectively in a procedure similar to that described above, the signal output from the data selection circuit 629*c* will be set to "1000," and the signals output from the first decoder 622 and the second decoder 628 at the following rise of the CLK will be set to "000 Fh" and "00 FFh" respectively, to select the current output circuits COC [1] through [4], thereby setting the level of the current output from the analog output terminal to 4 with the current output circuits COC [1] through [8] in the operating state. It is to be noted that since the subsequent operation can be easily deduced by persons skilled in the art by referring to FIG. 17, its detailed explanation is omitted.

Now, let us consider a situation in which color data "1111" are input. When the color data are set to "1111," a signal "7 FFFh" that corresponds to the color data "1111" is output by the first decoder 622 from its SELECT [0:14] terminal through the procedure described earlier, and the level of the current output from the analog output terminal of the D/A converter 600 is set to 15. In this situation, with the signal "7 FFFh" output from the second decoder 628 three clock pulses in advance of the output of the signal "7 FFFh" by the first decoder 622, all the current output circuits COC in the current conversion circuit 621 are set in the operating state.

As has been explained, in the D/A converter 600 in the sixth embodiment of the present invention, which is provided with the data registers 623 over a plurality of stages, the period of time required before the output current becomes stable when switching the current output circuits COC from the stopped state to the operating state can be assured with ease, as in the case of the D/A converter 400 in the fourth embodiment of the present invention. In addition, when the operating frequency of the D/A converter becomes even higher, it is possible to secure the period of time required for the output current from the current output circuit COC to become stable by increasing the number of the data registers 623 as necessary without having to modify the structure of the current conversion circuit 621. Thus, an increase in the power consumption can be prevented without resulting in degradation in the characteristics of the D/A converter, so that a highly versatile D/A converter can be provided.

Moreover, in the D/A converter 600 in the sixth embodiment of the present invention, the period of the cycle starting at the input of color data and ending at the output of an analog signal can be reduced compared to that in the D/A converter 400 in the fourth embodiment of the present invention, as in the case of the D/A converter 500 in the fifth embodiment of the present invention.

Furthermore, the circuit scales of the decode signal registers 425*a*, 425*b* and 425*c*, the bit calculating adder 424, the first selection circuit 426 and the second selection circuit 427 must increase when the resolution of the D/A converter increases, since the number of bits in the decode signal from the first decoder 622 increases to a larger extent than the extent to which the number of bits in the input color data increases, as explained earlier, in the D/A converter 400 in the fourth embodiment of the present invention. In contrast, modification need to be made only to achieve the data selection circuit 629 and the second decoder 628 that are capable of performing the processing at the number of bits that are the same as the resolution of the D/A converter 600 in the sixth embodiment of the present invention, thereby making it possible to limit the increase in the circuit scales compared to that required in the D/A converter 400 in the fourth embodiment of the present invention, as in the case of the D/A converter 500 in the fifth embodiment of the present invention.

(Seventh embodiment)

Figure 18:
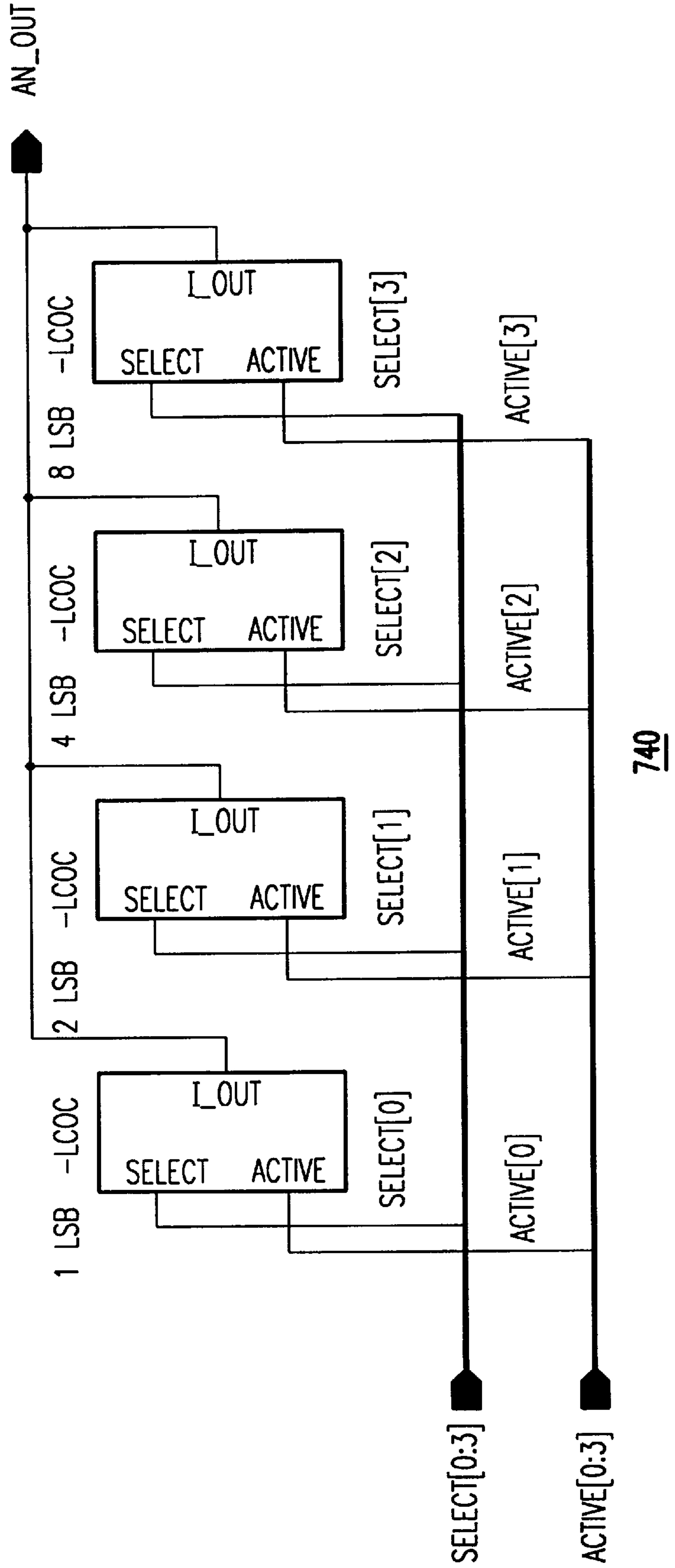
FIG. 18 is a circuit diagram illustrating an example of the weighted current conversion circuit that may be adopted in the D/A converter in the seventh and eighth embodiments of the present invention.
Figure 19:
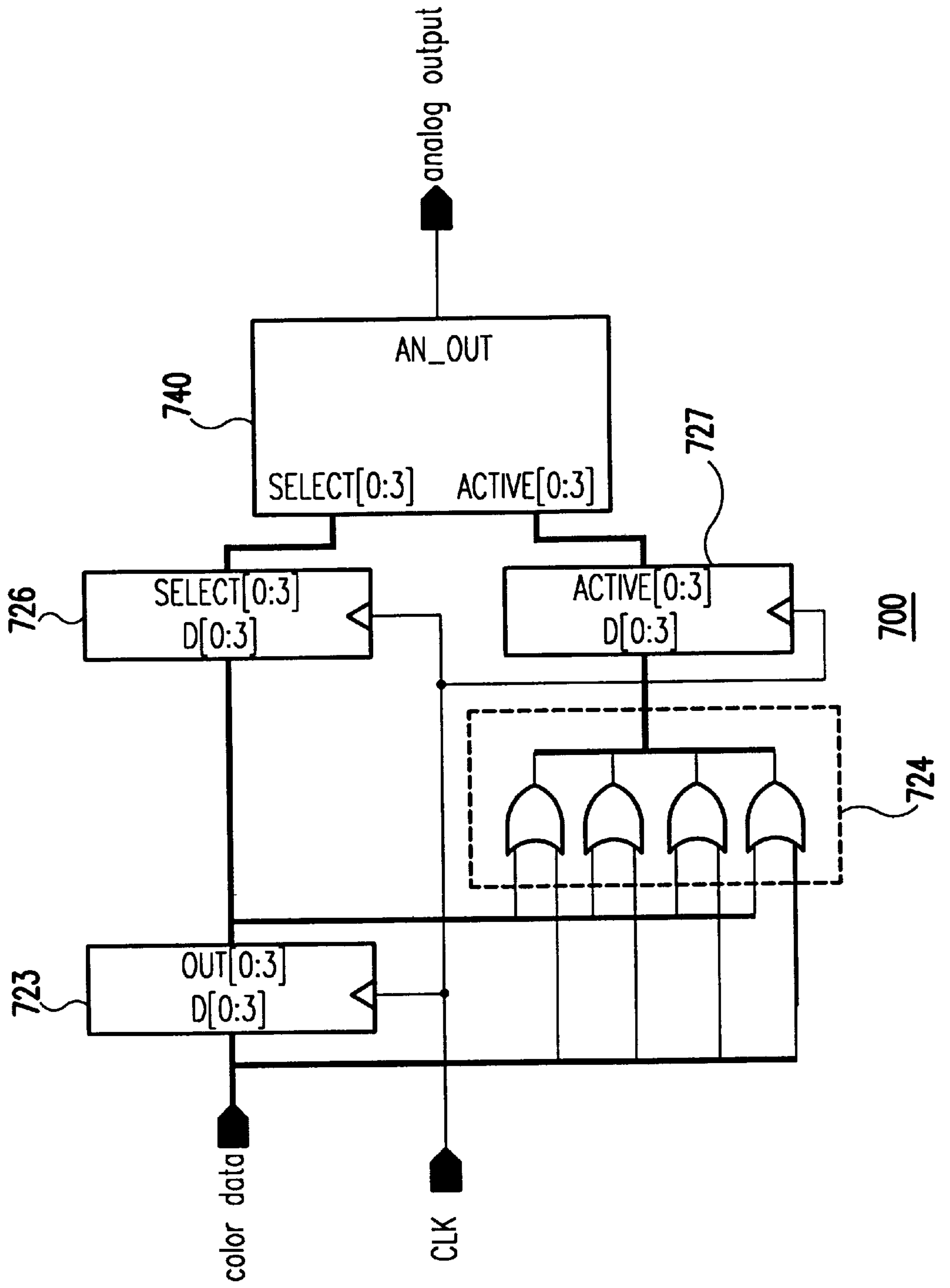
FIG. 19 is a circuit diagram illustrating a schematic structure of the D/A converter in the seventh embodiment of the present invention.
Figure 20:
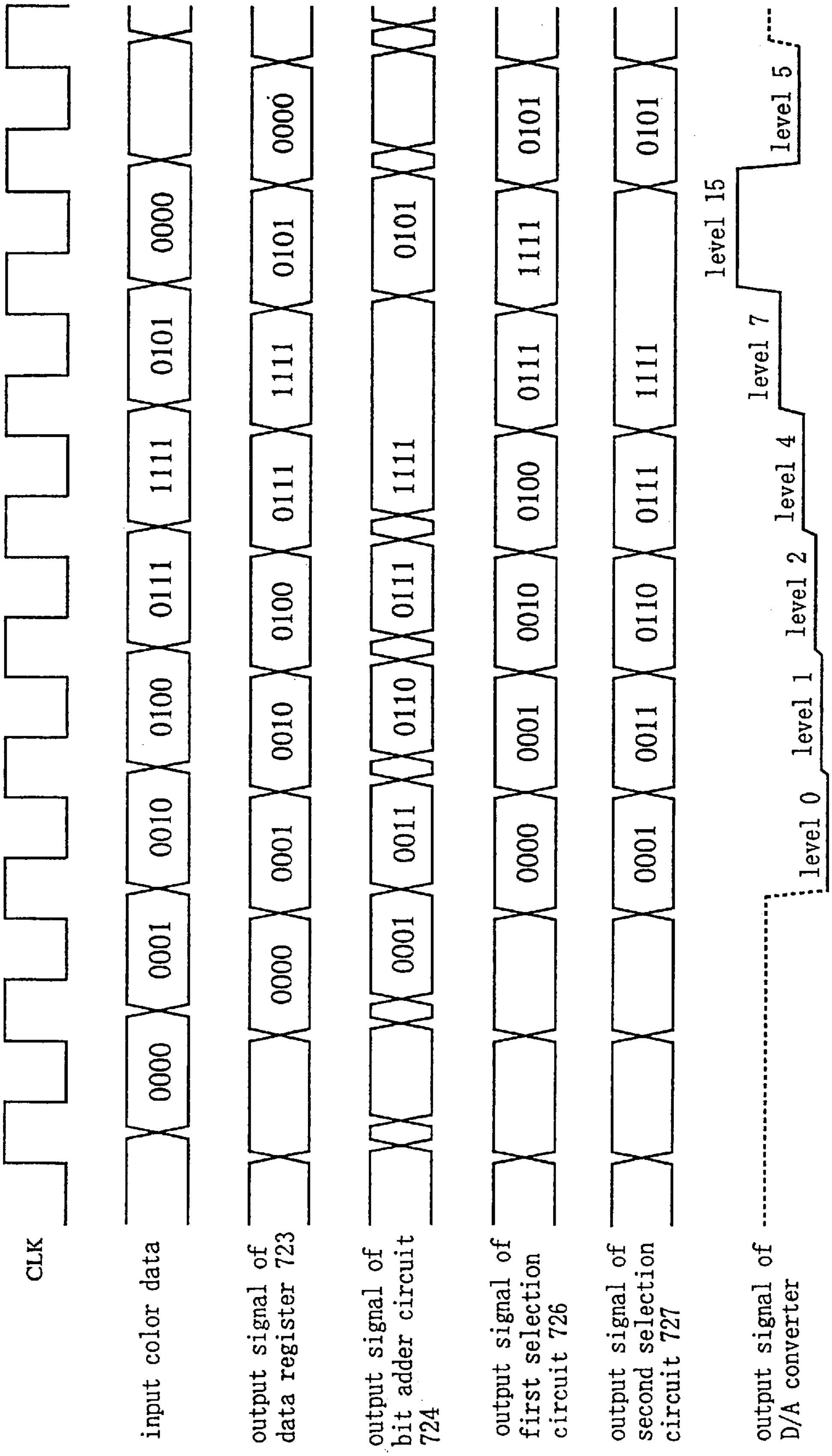
FIG. 20 is a timing chart illustrating the operation of the D/A converter in the seventh embodiment of the present invention.

Next, in reference to FIGS. 18 through 20, the structure and the operation of a D/A converter 700 in the seventh embodiment of the present invention are explained in detail.

While the output currents from the current output circuits COC in the current conversion circuit shown in FIG. 6 all bear the same value in the D/A converter 300, 400, 500 and 600 in the third, forth, fifth and sixth embodiments of the present invention, the current conversion circuit may be constituted by employing current output circuits LCOC that are weighted by $2^n$ (n=0, 1, 2, . . . ) as illustrated in FIG. 18. FIG. 18 presents a circuit diagram of a weighted current conversion circuit 740 employing weighted current output circuits LCOC in a D/A converter with 4-bit resolution and FIG. 19 presents a circuit diagram of a D/A converter 700 employing the weighted current conversion circuit 740.

As illustrated in FIG. 18, the weighted current conversion circuit 740 is provided with four current output circuits LCOC that are weighted at level 1 LSB, level 2 LSB, level 4 LSB and level 8 LSB, with the destination of the output of the output current from the current source in the level 8 LSB current output circuit LCOC switched by a SELECT [3] signal, the destination of the output of the output current from the current source in the level 4 LSB current output circuit LCOC switched by a SELECT [2] signal, the destination of the output of the output current from the current source in the level 2 LSB current output circuit LCOC switched by a SELECT [1] signal and the destination of the output of the output current from the current source in the level 1 LSB current output circuit LCOC switched by a SELECT [0] signal.

In addition, the operating/stopped state of the current source in the level 8 LSB current output circuit LCOC is controlled by an ACTIVE [3] signal, the operating/stopped state of the current source 30 in the level 4 LSB current output circuit LCOC is controlled by an ACTIVE [2] signal, the operating/stopped state of the current source 30 in the level 2 LSB current output circuit LCOC is controlled by an ACTIVE [1] signal and the operating/stopped state of the current source 30 in the level 1 LSB current output circuit LCOC is controlled by an ACTIVE [0] signal.

Since the level of the output current from each current output circuit COC is determined by the transistors for the current source 30 provided in the current output circuit COC, by providing the transistors for the current sources 30 in varying sizes, currents can be set at level 1 LSB, level 2 LSB, level 4 LSB and level 8 LSB.

In addition, as illustrated in FIG. 19, in the D/A converter 700 employing the weighted conversion circuit 740, 4-bit color data are input via the color data input terminal to the D [0:3] terminal of a data register 723 and an input terminal of a bit adder circuit 724. The signal output from the OUT [0:3] terminal of the data register 723 is input to the D [0:3] terminal of a first selection circuit 726 and the other input terminal of the bit adder circuit 724. The signal output from the bit adder circuit 724 is input to the D [0:3] terminal of a second selection circuit 727.

Then, the signal output from the SELECT [0:3] terminal of the first selection circuit 726 is input to the SELECT [0:3] terminal of the weighted current conversion circuit 740, the signal output from the ACTIVE [0:3] terminal of the second selection circuit 727 is input to the ACTIVE [0:3] terminal of the weighted current conversion circuit 740 and the signal output from the AN_OUT terminal of the weighted current conversion circuit 740 constitutes the output signal of the D/A converter 700. Moreover, a clock pulse is input via the CLK input terminal to the data register 723, the first selection circuit 726 and the second selection circuit 727. It is to be noted that the first selection circuit 726 and the second selection circuit 727 may be constituted of a register, having an identical circuit structure to that of the data register 723.

Next, in reference to the timing chart presented in FIG. 20, the operation of the D/A converter 700 in the seventh embodiment of the present invention is explained.

As illustrated in FIG. 20, when color data "0000" are input via the color data input terminal, the data register 723 holds the color data "0000" and outputs them to the first selection circuit 726 and the bit adder circuit 724 at the following rise of the CLK. Then, when the next color data "0001" are input via the input terminal, the bit adder circuit 724 inputs the input color data and the output signal from the data register 723 and outputs a signal ("0001") constituted of the OR of the common bits in the two signals to the second selection circuit 727.

At the following rise of the CLK, the first selection circuit 726 holds the signal "0000" output from the data register 723 and outputs the SELECT signal for selecting the current output circuit LCOC in the weighted current conversion circuit 740 to the SELECT [0:3] terminal of the weighted current conversion circuit 740 from the SELECT [0:3] terminal of the first selection circuit 726, whereas the second selection circuit 727 holds the signal "0001" output from the bit adder circuit 724 and outputs the ACTIVE signal for controlling the operating state of the current source in the current output circuits LCOC to the ACTIVE [0:3] terminal of the weighted current conversion circuit 740 from the ACTIVE [0:3] terminal of the second selection circuit 727.

Thus, since the data "0000" are input to the SELECT [0:3] terminal of the weighted current conversion circuit 740, none of the current output circuits LCOC in the weighted current conversion circuit 740 illustrated in FIG. 18 are selected, thereby setting the level of the current output from the analog output terminal of the D/A converter 700 to 0. In addition, since the data "0001" are input to the ACTIVE [0:3] terminal of the weighted current conversion circuit 740, the level 1 LSB current output circuit LCOC is set in the operating state.

Moreover, as illustrated in FIG. 20, at the following rise of the CLK, the data "0001" are input to the SELECT [0:3] terminal of the weighted current conversion circuit 740, resulting in the level 1 LSB current output circuit LCOC being selected, to set the level of the current output from the analog output terminal to 1. In addition, since data "0011" are input to the ACTIVE [0:3] terminal of the weighted current conversion circuit 740, the level 1 LSB current output circuit LCOC and the level 2 LSB current output circuit LCOC are set in the operating state.

Then, at the following rise of the CLK, since data "0010" are input to the SELECT [0:3] terminal of the weighted current conversion circuit 740, the level 2 LSB current output circuit LCOC is selected to set the level of the current output from the analog output terminal to 2, and since data "0110" are input to the ACTIVE [0:3] terminal of the weighted current conversion circuit 740, the level 2 LSB current output circuit LCOC and the level 4 LSB current output circuit LCOC are set in the operating state. Since the subsequent operations can be easily deduced by persons skilled in the art by referring to FIG. 20, its detailed explanation is omitted.

Now, let us consider a situation in which the color data "1111" are input. When the color data are "1111" with the signal "1111" output from the first selection circuit 726 through the procedure described above, all the current output circuits LCOC within the weighted current conversion circuit 740 are selected to set the level of the current output from the analog output terminal of the D/A converter 700 to 15, and since the signal "1111" is output by the second selection circuit 727 one clock pulse in advance of the output of the signal "1111" by the first selection circuit 726, all the current output circuits LCOC in the weighted current conversion circuit 740 are set in the operating state one clock pulse in advance.

As has been explained, in the D/A converter 700 in the seventh embodiment of the present invention, the power consumption can be kept down without degrading the characteristics of the D/A converter, as in the case of the D/A converter 300 in the third embodiment of the present invention.

In addition, in the D/A converter 700 in the seventh embodiment of the present invention, the period of the cycle starting at the input of the color data and ending at the output of the analog signal can be shortened compared to that in the D/A converter 300 in the third embodiment of the present invention as in the D/A converter 500 in the fifth embodiment of the present invention.

Furthermore, since the D/A converter 700 in the seventh embodiment of the present invention can be achieved through a simpler circuit structure compared to those constituting the D/A converters 300, 400, 500 and 600 in the third through sixth embodiments of the present invention, its effect of keeping down the power consumption is expected to be realized to a greater extent, and, at the same time, the area occupied by the D/A converter on the chip can be reduced.

(Eighth embodiment)

Figure 21:
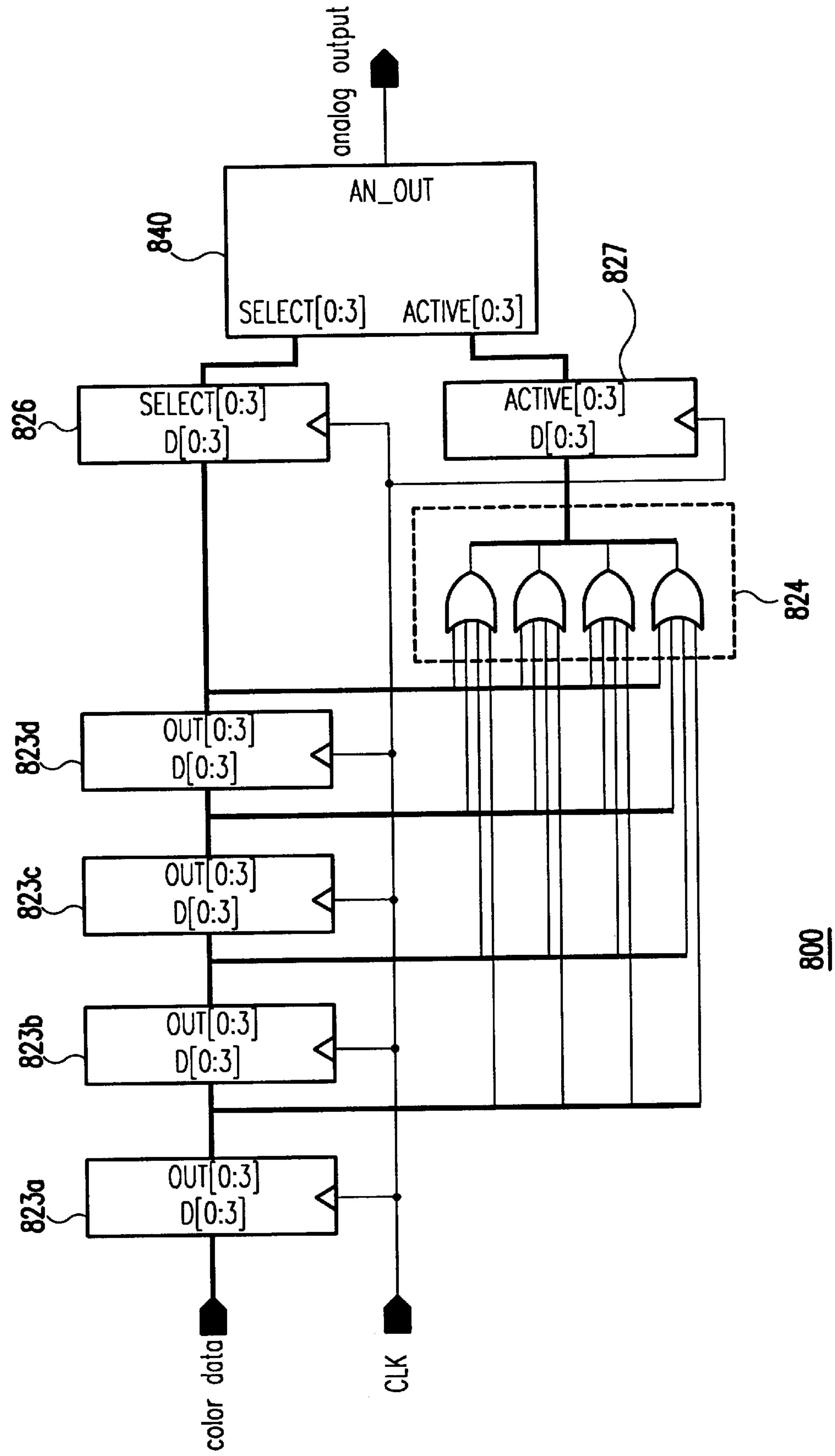
FIG. 21 is a circuit diagram illustrating a schematic structure of the D/A converter in the eighth embodiment of the present invention.
Figure 22:
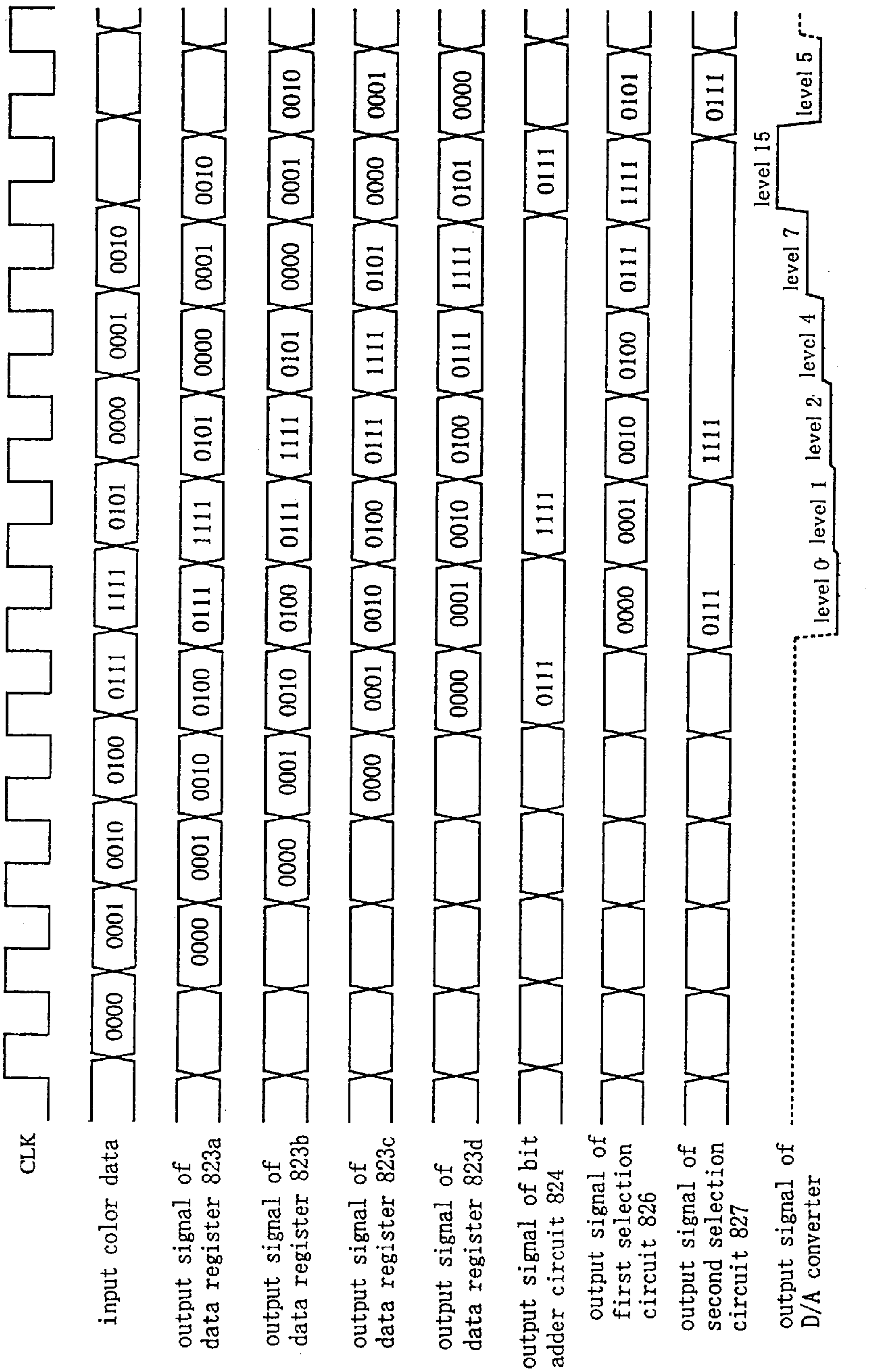
FIG. 22 is a timing chart illustrating the operation of the D/A converter in the eighth embodiment of the present invention.

Next, the structure and the operation of a D/A converter 800 in the eighth embodiment of the present invention are explained in reference to FIGS. 21 and 22.

In the D/A converter 700 in the seventh embodiment of the present invention, when the current source of a current output circuit LCOC to be selected by the first selection circuit 726 in correspondence to the input color data is in the stopped state, a period of time corresponding to one clock pulse is allowed to elapse after the current source is set in the operating state by the second selection circuit 727 before the current source is actually selected by the first selection circuit 726. However, as the operating speed of the D/A converter becomes higher, a period of time corresponding to one clock pulse may not be sufficient for the output current to stabilize even though the current source has been switched from the stopped state to the operating state.

To eliminate this problem, the D/A converter 800 in the eighth embodiment of the present invention is constituted by providing data registers 823 (**823*a*, 823*b*, 823*c* and 823*d*) over a plurality of stages and inputting the output signals 823*a*, 823*b*, 823*c* and 823*d* from the individual decode signal registers to a bit adder circuit 824 where the common bits in those output signals are added so that only the current sources of current output circuits COC selected by a first selection circuit 826 in correspondence to the output signals from the decode signal registers are set into the operating state. In addition, it becomes possible to allow a period of time that corresponds to a plurality of clock pulses to elapse after a current source is set into the operating state by the second selection circuit 827 before it is actually selected by the first selection circuit 826**.

Next, in reference to FIG. 21, the structure of the D/A converter 800 in the eighth embodiment of the present invention is explained. As shown in FIG. 21, when 4-bit color data are input to the D [0:3] terminal of a data register **823*a* from the color data input terminal, the signal output from the OUT [0:3] terminal of the data register 823*a* is input to the D [0:3] terminal of the data register 823*b* and an input terminal of the bit adder circuit 824, the signal output from the OUT [0:3] terminal of the data register 823*b* is input to the D [0:3] terminal of the data register 823*c* and an input terminal of the bit adder circuit 824, the signal output from the OUT [0:3] terminal of the data register 823*c* is input to the D [0:3] terminal of the data register 823*d* and an input terminal of the bit adder circuit 824 and the signal output from the OUT [0:14] terminal of the data register 823*d* is input to the D [0:3] terminal of the first selection circuit 826 and an input terminal of the bit adder circuit 824**.

The signal output from the bit adder circuit 824 is input to the D [0:3] terminal of the second selection circuit 827. The signal output from the SELECT [0:3] terminal of the first selection circuit 826 is input to the SELECT [0:3] terminal of the weighted current conversion circuit 840, the signal output from the ACTIVE [0:3] terminal of the second selection circuit 827 is input to the ACTIVE [0:3] terminal of the weighted current conversion circuit 840 and the signal output from the AN_OUT terminal of a weighted current conversion circuit 840 constitutes the output signal of the D/A converter 800. In addition, a clock pulse is input via the CLK input terminal to the data registers 823*a*, 823*b*, 823*c* and 823*d*, the first selection circuits 826 and the second selection circuit 827.

Next, in reference to the timing chart presented in FIG. 22, the operation of the D/A converter 800 in the eighth embodiment of the present invention is explained in detail.

As shown in FIG. 22, when the color data "0000" are input via the color data input terminal, the data register 823*a* holds the color data "0000" and outputs it to the data register 823*b* and the bit adder circuit 824 at the following rise of the CLK.

Likewise, when next color data "0001" are input via the color data input terminal, the data register 823*a* holds the color data "0001" to output it to the data register 823*b* and the bit adder circuit 824 and, at the same time, the data register 823*b* holds the signal "0000" output from the data register 823*a* prior to the rise of the CLK to outputs it to the data register 823*c* and the bit adder circuit 824 at the following rise of the CLK.

In the same manner, when next color data "0010" are input, the data register 823*a* outputs the signal "0010" to the data register 823*b* and the bit adder circuit 824, the data register 823*b* outputs the signal "0001" to the data register 823*c* and the bit adder circuit 824 and the data register 823*c* outputs the signal "0000" to the data register 823*d* and the bit adder circuit 824 at the following rise of the CLK.

Likewise, when next color data "0100" are input, the data register 823*a* outputs the signal "0100" to the data register 823*b* and the bit adder circuit 824, the data register 823*b* outputs a signal "0010" to the data register 823*c* and the bit adder circuit 824, the data register 823*c* outputs the signal "0001" to the data register 823*d* and the bit adder circuit 824, and the data register 823*d* outputs the signal "0000" to the first selection circuit 826 and the bit adder circuit 824 at the following rise of the CLK. As a result, the output signals from the data registers 823*a*, 823*b*, 823*c* and 823*d* are input to the bit adder circuit 824 so that a signal ("0111") constituted of the OR of the common bits in the four signals is output to the second selection circuit 827.

Then, at the following rise of the CLK, the first selection circuit holds the signal "0000" output from the data register 823*d* and outputs the SELECT signal for selecting the current output circuit LCOC in the weighted current conversion circuit 840 to the SELECT [0:3] terminal of the weighted current conversion circuit 840 from the SELECT [0:3] terminal of the first selection circuit 826, and at the same time, the second selection circuit 827 holds the signal "0111" output from the bit adder circuit 824 and outputs the ACTIVE signal for controlling the operating state of the current source in the current output circuits LCOC to the ACTIVE [0:3] terminal of the weighted current conversion circuit 840 from the ACTIVE [0:3] terminal of the second selection circuit 827. Consequently, since the data "0000" are input to the SELECT [0:3] terminal of the weighted current conversion circuit 840, none of the current output circuits COC in the weighted current conversion circuit 840 shown in FIG. 18 are selected, thereby setting the level of the current output from the analog output terminal of the D/A converter to 0.

In addition, since the data "0111" are input to the ACTIVE [0:3] terminal of the weighted current conversion circuit 840, the level 1 LSB current output circuits LCOC, the level 2 LSB current output circuit LCOC and the level 4 LSB current output circuit LCOC are set in an the operating state. Then, as shown in FIG. 22, at the following rise of the CLK, the data "0001" are input to the SELECT [0:3] terminal of the weighted current conversion circuit 840, the level 1 LSB current output circuit LCOC is selected, thereby setting the level of the current output from the analog output terminal to 1, and since the data "0111" are input to the ACTIVE [0:3] terminal of the weighted current conversion circuit 840, the level 1 LSB current output circuit LCOC, the level 2 LSB current output circuit LCOC and the level 4 LSB current output circuit LCOC are set in the operating state.

Then, at the following rise of the CLK, the data "0010" are input to the SELECT [0:3] terminal of the weighted current conversion circuit 840 to select the level 2 LSB current output circuit LCOC, setting the level of the current output from the analog output terminal to 2, and also, since the data "1111" are input to the ACTIVE [0:3] terminal of the weighted current conversion circuit 840, all the current output circuits LCOC are set in the operating state. Since the subsequent operation can be easily deduced by persons skilled in the art by referring to FIG. 22, its detailed explanation is omitted.

Now, let us consider a situation in which the color data are set to "1111" are input. When the color data are set to "1111" with the signal "1111" output from the first selection circuit 826 through the procedure described above, all the current output circuits COC within the weighted current conversion circuit 840 are selected to set the level of the current output from the analog output terminal of the D/A converter 800 to 15, and since the signal "1111" is output by the second selection circuit 827 three clock pulses in advance of the output of the signal "1111" by the first selection circuit 826, all the current output circuits LCOC in the weighted current conversion circuit 840 are set in the operating state three clock pulses in advance.

As has been explained, in the D/A converter 800 in the eighth embodiment of the present invention, the period of time required for the output current to stabilize can be assured, as in the case of the D/A converter 400 in the fourth embodiment of the present invention, even when the operating frequency of the D/A converter becomes even higher, simply by increasing the number of the data registers 823 without having to modify the structure of the weighted current conversion circuit 840. Thus, an increase in the power consumption can be prevented without resulting in degradation in the characteristics of the D/A converter so that a highly versatile D/A converter can be provided.

Moreover, in the D/A converter 800 in the eighth embodiment of the present invention, the period of the cycle starting at the input of color data and ending at the output of an analog signal can be reduced compared to that in the D/A converter 400 in the fourth embodiment of the present invention, as in the case of the D/A converter 500 in the fifth embodiment of the present invention.

Furthermore, since the D/A converter 800 in the eighth embodiment of the present invention can be achieved through a simpler circuit structure compared to those constituting the D/A converters 300, 400, 500 and 600 in the third through sixth embodiments of the present invention, its effect of keeping down the power consumption is expected to be realized to a greater extent, and, at the same time, the area occupied by the D/A converter on the chip can be reduced, as in the D/A converter 700 in the seventh embodiment of the present invention.

While the color palette RAM and the D/A converter according to the present invention have been particularly shown and described with reference to preferred embodiments thereof by referring to the attached drawings, the present invention is not limited to these examples. It will be understood by those skilled in the art that various changes in form and detail may be made therein without departing from the spirit, scope and teaching of the invention.

Figure 23:
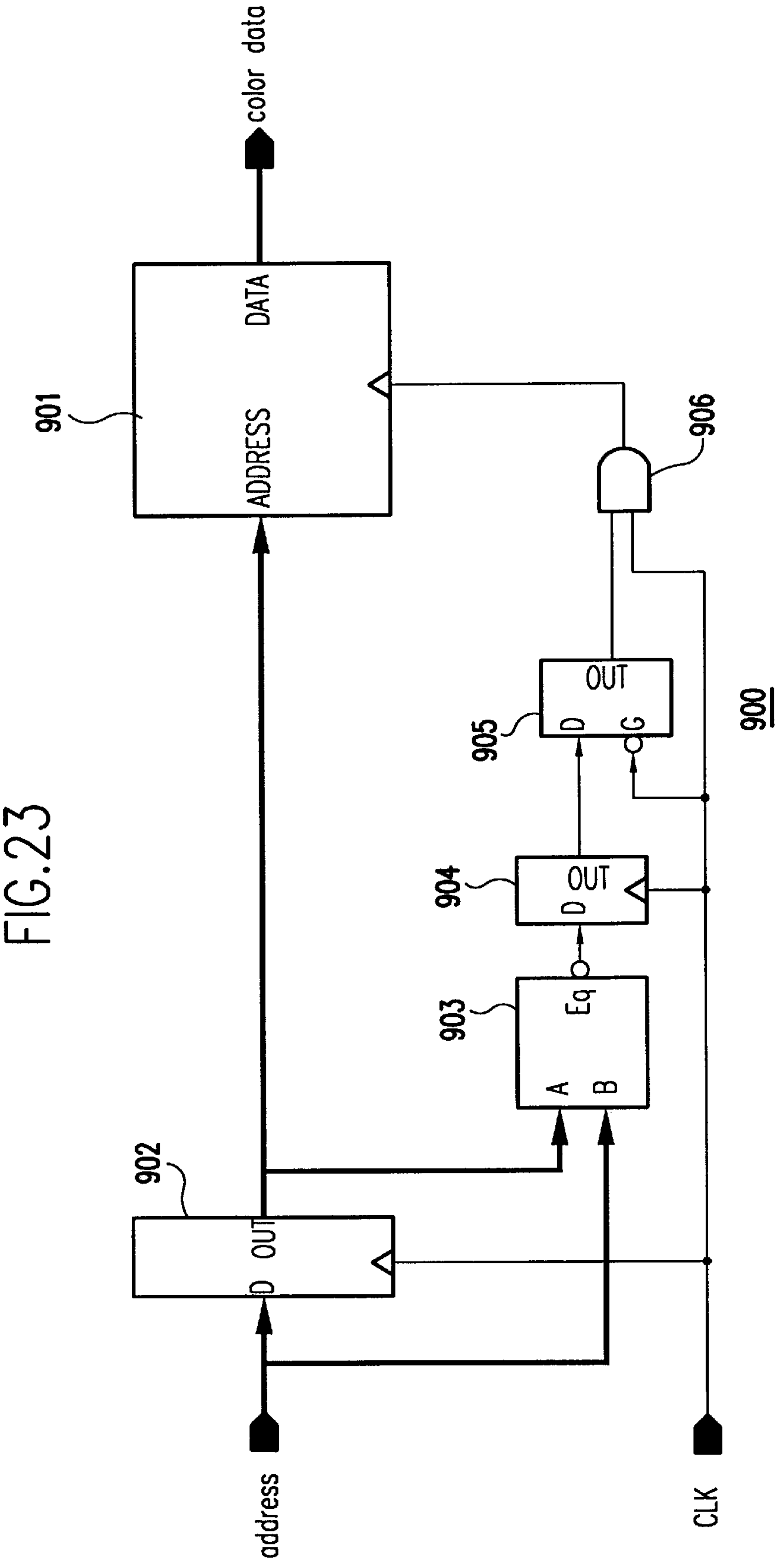
FIG. 23 is a circuit diagram illustrating a schematic structure of yet another embodiment of the color palette RAM according to the present invention.
Figure 24:
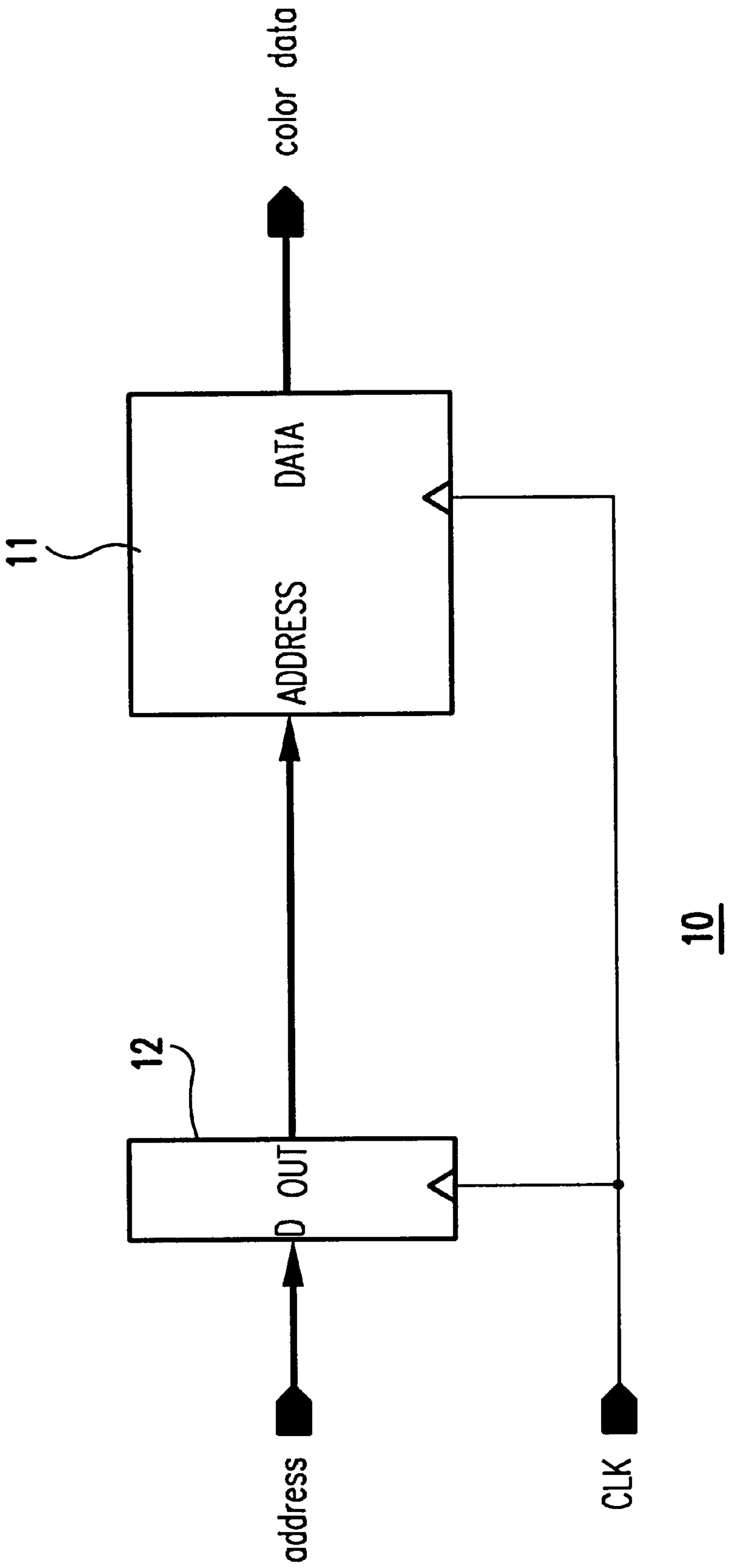
FIG. 24 is a circuit diagram illustrating a schematic structure of a color palette RAM in the prior art.
Figure 25:
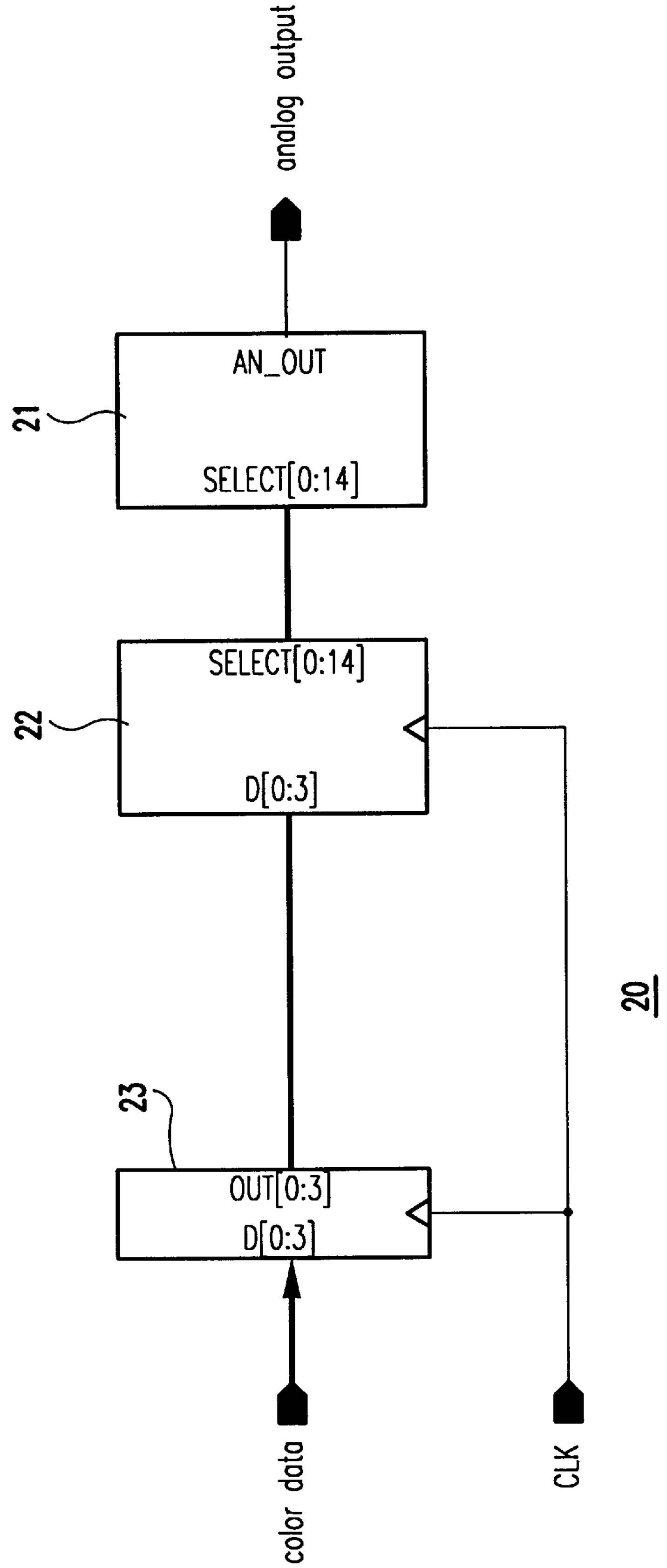
FIG. 25 is a circuit diagram illustrating a schematic structure of a current output type D/A converter for graphics applications in the prior art.
Figure 26:
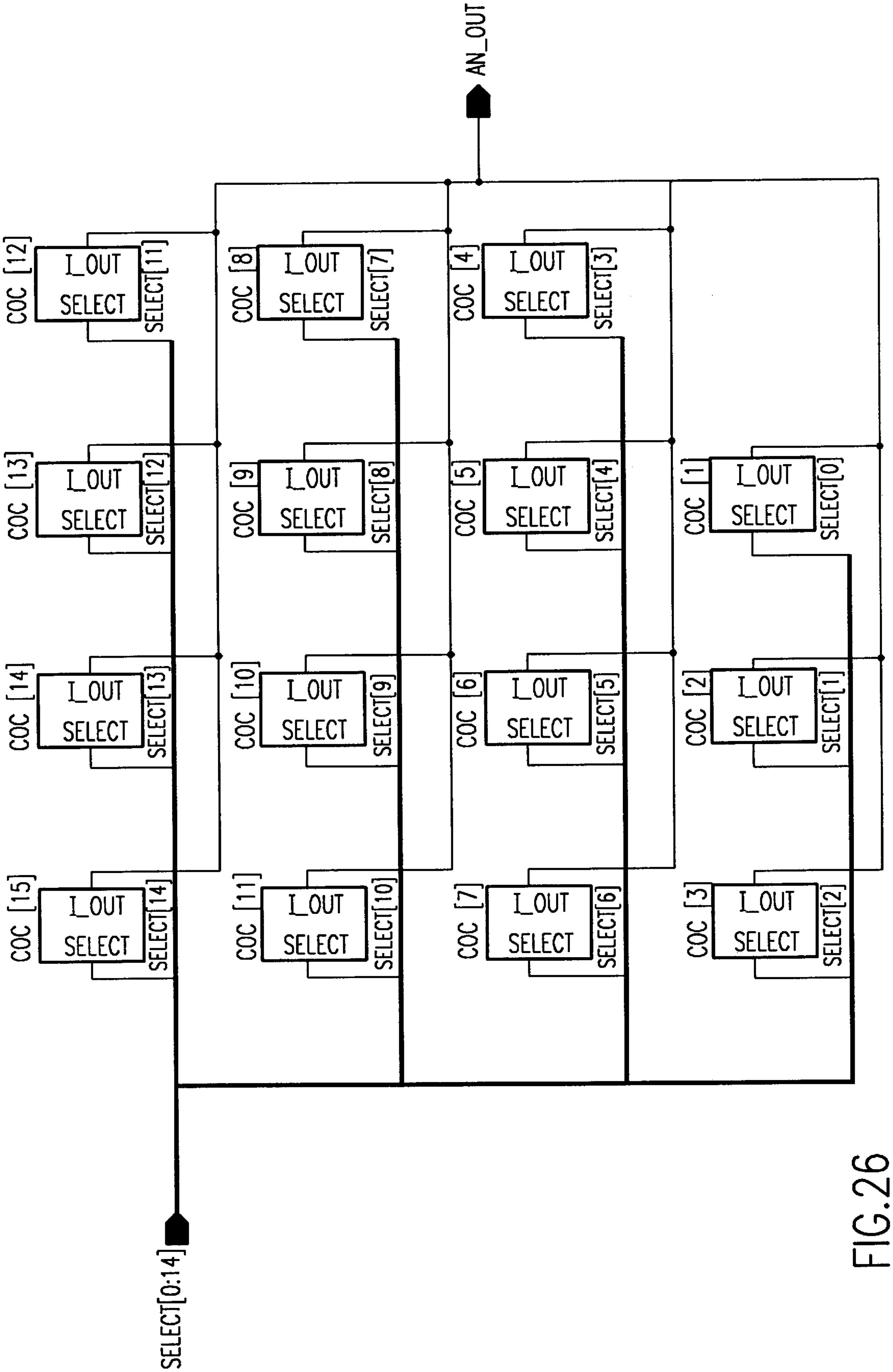
FIG. 26 is a circuit diagram illustrating an example of current conversion circuits in the prior art.
Figure 27:
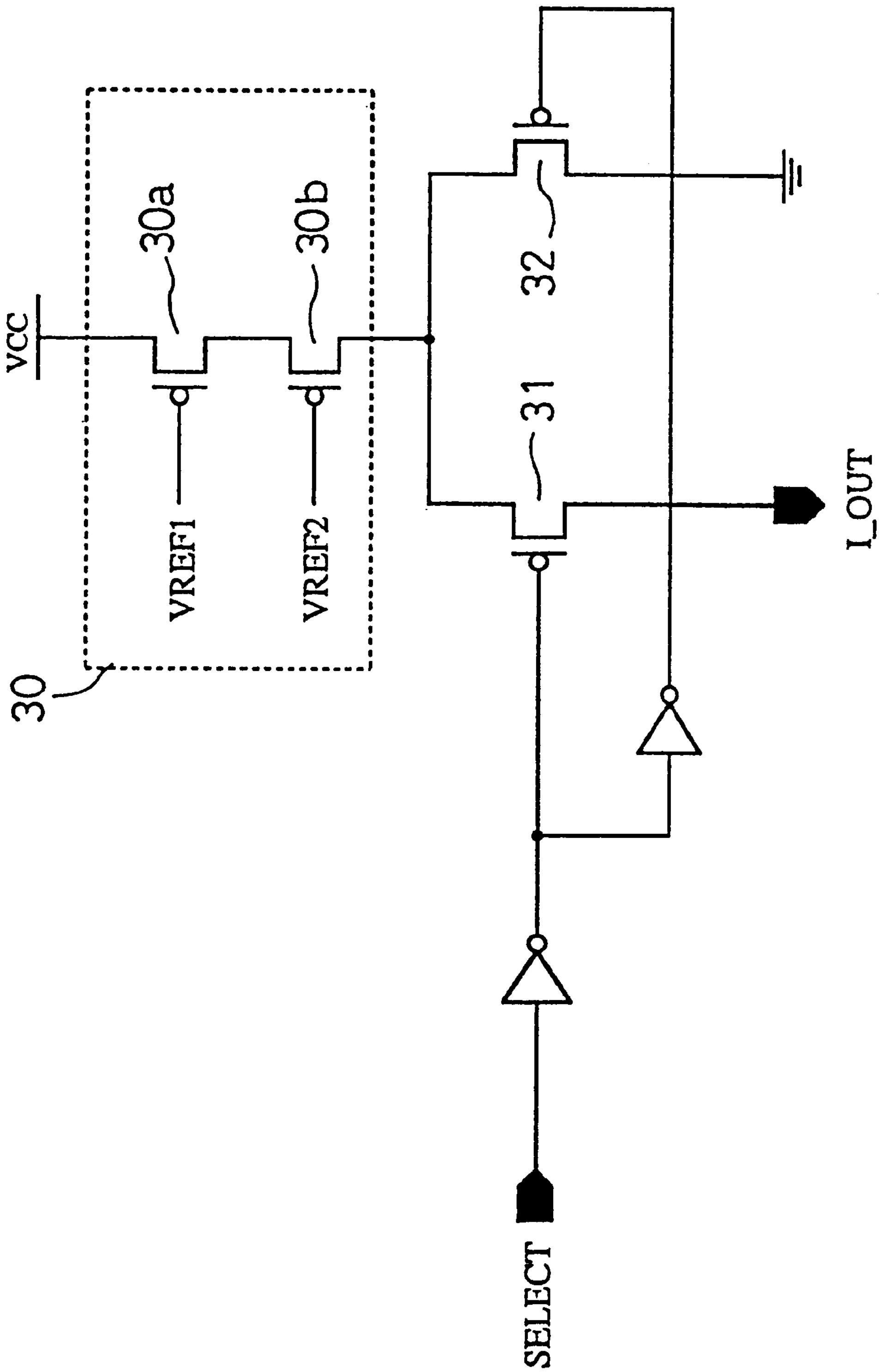
FIG. 27 is a circuit diagram illustrating an example of current output circuits in the prior art.
Figure 28:
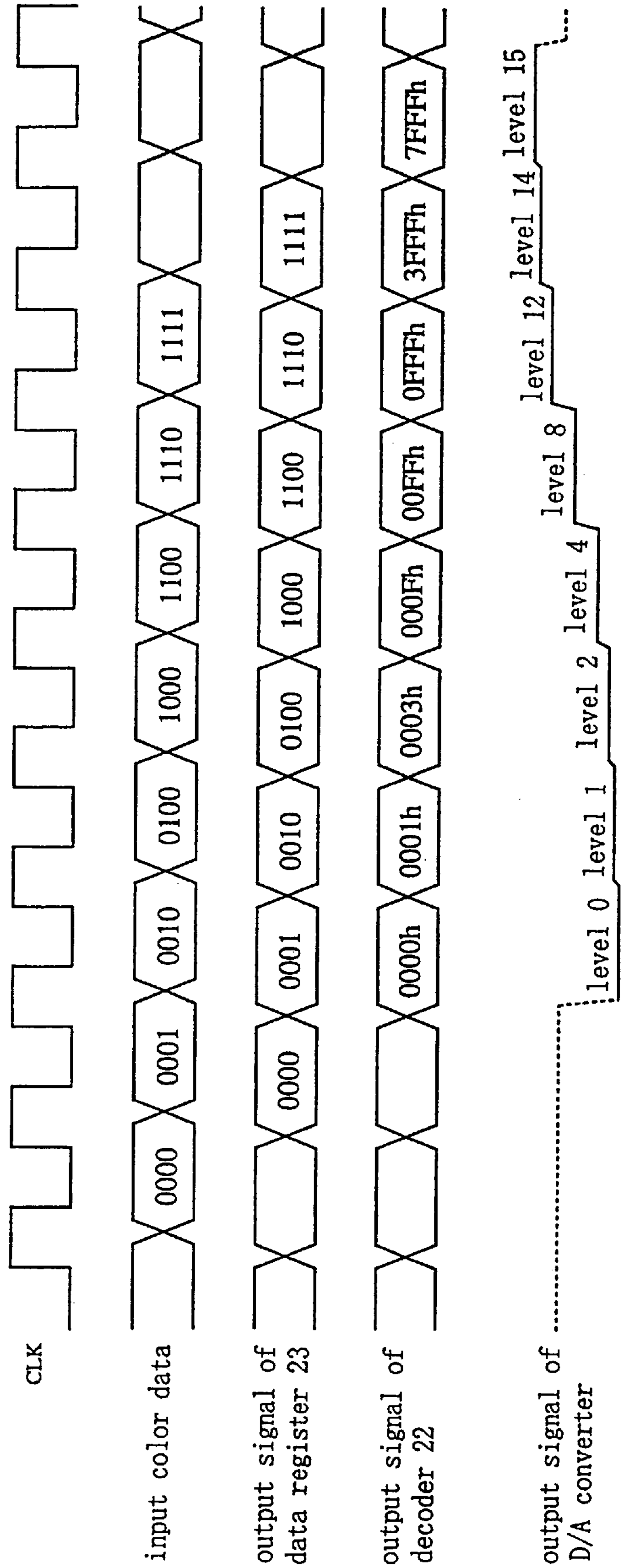
FIG. 28 is a timing chart illustrating the operation of the current output type D/A converter for graphics applications in the prior art.

For instance, while a CE terminal for setting the RAM 101 in a disabled state is provided in the color palette RAM 100 in the first embodiment of the present invention, similar advantages can be achieved in the color palette RAM 900 illustrated in FIG. 23 without having to provide the CE terminal.

In the color palette RAM 900 illustrated in FIG. 23, a structure in which the supply of the clock pulse to a RAM 901 is stopped when the output signal from a D-type latch 905 is set to low, is achieved by providing a two-input AND gate 906, connecting the OUT terminal of the D-type latch 905 and the CLK input terminal to the input terminals of the two-input AND gate 906 and connecting the CLK terminal of the RAM 901 to the output terminal of the two-input AND gate 906. Since the other aspects of the circuit operation are identical to those already explained in reference to the color palette RAM 100 in the first embodiment, their detail explanation is omitted. Through this structure, advantages similar to those achieved by the color palette RAM 100 according to the present invention can be achieved without having to modify the structure of the RAM 11 in the prior art.

In addition, advantages similar to those achieved by the color palette RAM 200 in the second embodiment of the present invention may be achieved without having to provide a CE terminal in the RAM 201, as in the case of the circuit illustrated in FIG. 23. In this circuit variation, too, as in the color palette RAM 900 illustrated in FIG. 23, a two-input AND gate is provided, the OUT terminal of the D-type latch and the CLK input terminal are connected to the input terminals of the two-input AND gate and the CLK terminal of the RAM is connected to the output terminal to stop the supply of the clock pulse to the RAM when the output signal from the D-type latch is set to low.

While the bit adder circuits 324 and 424 in the D/A converters 300 and 400 in the third and forth embodiments of the present invention are constituted by employing an OR gate as illustrated in FIGS. 5 and 7, if the color data are negative logic data, the D/A converters 300 and 400 may instead be constituted by employing an AND gate. However, the circuit structures of the bit adder circuits 324 and 424 in FIGS. 5 and 7 are only examples, and as long as the bit adder circuits 324 and 424 are provided with a function for generating data having the same bit length by adding common bits in the output signals from the decoders 322 and 422 and the decode signal registers 325 (325*a*, 325*b*, 325*c*) and 425 (425*a*, 425*b*, 425*c*), no restrictions are imposed upon the D/A converters 300 and 400 in the third and forth embodiments of the present invention in regard to the structures of the bit adder circuits 324 and 424.

Likewise, in the D/A converters 700 and 800 in the seventh and eighth embodiments of the present invention are not subject to any restrictions in regard to the structures of the bit adder circuits 724 and 824.

In addition, while a circuit diagram representing an example of the data selection circuits 529 and 629 (629*a*, 629*b*, 629*c*) that may be employed in the D/A converters 500 and 600 in the fifth and sixth embodiments of the present invention is presented in FIG. 13, no restrictions are imposed upon the structures of the data selection circuits 529 and 629 in the D/A inverters 500 and 600 in the fifth and sixth embodiments of the present invention as long as the data selection circuits 529 and 629 have a function for comparing the size of input data and outputting the higher-order data.

While the data selection circuit 629 in the D/A converter 600 in the sixth embodiment of the present invention has a structure in which three circuits, each of which compares the sizes of two sets of data to output the higher-order data are employed to output the highest-order data among the four sets of data, a structure in which the sizes of four sets of data are compared at once to output the highest-order data may be adopted, instead, and as explained above, as long as the data selection circuit 629 has a function for outputting the highest-order data among a plurality of sets of input data, no restrictions in regard to the method for comparing the sizes of data are imposed upon the D/A converter 600 in the sixth embodiment of the present invention.

Furthermore, while the highest-order data is selected by the data selection circuits 629*a*, 629*b* and 629*c* only from the output signals from the data registers 623*a*, 623*b*, 623*c* and 623*d* in the D/A converter 600 in the sixth embodiment of the present invention, a structure in which the highest-order data among data signals including the color data input via the color data input terminal is selected, as in the case of the D/A converter 500 in the fifth embodiment of the present invention, may be adopted, instead.

While a circuit diagram representing an example of the current output circuits COC employed in the D/A converter according to the present invention is presented in FIG. 8, as long as the current output circuits COC have a function for controlling the operation of the current source 30 based upon the ACTIVE signal and switching the destination of the output of output current from the current sources 30 based upon the SELECT signal, there are no restrictions in regard to the structure of the current output circuits COC in the D/A converter according to the present invention.

In addition, while a circuit structure representing an example of the current conversion circuits 321, 421, 521 and 621 that may be adopted in the D/A converters 300, 400, 500 and 600 in the third through sixth embodiments of the present invention is presented in FIG. 6 and a circuit diagram representing an example of the weighted current conversion circuit 740 and 840 which may be adopted in the D/A converters 700 and 800 in the seventh and eighth embodiments of the present invention is presented in FIG. 18, as long as the current conversion circuits 321, 421, 521 and 621 and the weighted current conversion circuits 741 and 841 have a function for converting color data to a desired current value, no restrictionsin regard to the structures of the current conversion circuits 321, 421, 521 and 621 and the weighted current conversion circuit 740 and 841 are imposed upon the D/A converter according to the present invention.

Furthermore, while the D/A converters in the individual embodiments of the present invention that have been explained are D/A converters with 4-bit resolution, no restrictions in regard to the resolution are imposed upon the D/A converter according to the present invention.

Moreover, as most D/A converters for graphics applications and video applications in recent years are D/A converters with high resolution of 8-bits or more, a high resolution D/A converter may be constituted by employing the following method. Namely, an 8-bit resolution D/A converter which handles 8-bit input color data may be constituted by dividing the color data into the higher-order 4 bits and the lower-order 4 bits employing two D/A converters 500 in the fifth embodiment of the present invention, one of which is illustrated in FIG. 12, with the analog output terminal of the D/A converter controlled by the higher-order bits and the D/A converter controlled by the lower-order bits connected with each other, providing 15 current output circuits LCOC that output level 1 LSB currents at the current conversion circuit of the D/A converter controlled by the lower-order bits and providing 15 current output circuits LCOC that output 16 LSB level currents at the current conversion circuit of the D/A converter controlled by the higher-order bits. Furthermore, the D/A converter 700 in the seventh embodiment of the present invention illustrated in FIG. 19 may be employed as the D/A converter that is controlled by the lower-order bits instead, and there are various other combinations that may be adopted and these, too, are obviously within the technical scope of the present invention.

Moreover, the D/A converter according to the present invention is not limited to use in graphics applications, and it may be adopted in all types of current output type D/A converters provided with a current source.

As has been explained, according to the present invention, a low power consumption type color palette RAM that is capable of minimizing the level of power consumed through a precharge operation and the like by setting the RAM in a disabled state when the same address is input is provided.

In addition, according to the present invention, a low power consumption type D/A converter which is capable of achieving a stable output current by stopping a current output circuit when it is not selected and setting the current output circuit in the operating state in advance when it is to be selected through effective control of the operating/stopped state of the current output circuits in the current conversion circuit is provided.

Furthermore, according to the present invention, a current output type D/A converter for graphics applications that demonstrates outstanding versatility, is capable of supporting higher operating frequencies and is capable of effectively minimizing the power consumption particularly when the same color data continue without having to increase the circuit scale, is provided.

The entire disclosure of Japanese Patent Application No. 9-227216 filed on Aug. 7, 1997 incouding specification, claims, drawings and summary is incorporated herein by reference in its entirety.

What is claimed is:

1. A D/A converter for converting a digital signal to a current value, comprising:

a decoder that outputs a first decode signal corresponding to said digital signal;

a decode signal register that holds said first decode signal provided by said decoder and outputs a second decode signal;

a bit adder circuit that adds common bits in said first decode signal provided by said decoder and said second decode signal provided by said decode signal register and generates a third decode signal having a bit length equal to bit lengths of said first decode signal and said second decode signal; and a current conversion circuit having a plurality of current output circuits that switch between an operating state and a stopped state based upon said third decode signal, which outputs a current value corresponding to the number of current output circuits selected in correspondence to said second decode signal.

2. A D/A converter according to claim 1, wherein:

said decode signal register is constituted by connecting a group of decode signal sub-registers in cascade over a plurality of stages and said bit adder circuit adds common bits in a plurality of second decode signals provided by said group of decode signal sub-registers and said first decode signal to generate said third decode signal.

3. A D/A converter according to claim 1, wherein:

said current conversion circuit is provided with a plurality of current output circuits that are weighted by a factor of $2^n$ (n=0, 1, 2, . . . ).

4. A D/A converter for converting a digital signal to a current value, comprising:

a data register that holds first digital data that have been input and outputs second digital data;

a first decoder that outputs a first decode signal corresponding to said second digital signal;

a data selection circuit that compares sizes of said first digital signal and said second digital signal from said data register and outputs a third digital signal;

a second decoder that outputs a second decode signal corresponding to said third digital data; and a current conversion circuit having a plurality of current output circuits that switch between an operating state and a stopped state in correspondence to said second decode signal, that outputs a current value corresponding to the number of current output circuits selected in correspondence to said first decode signal.

5. A D/A converter according to claim 4, wherein:

said data register is constituted by connecting a group of data sub-registers in cascade over a plurality of stages and said data selection circuit compares a plurality of sets of said first digital data input to said group of data sub-registers and a plurality of sets of said second digital data output from said group of data sub-registers.

6. A D/A converter according to claim 4, wherein:

said current conversion circuit is provided with a plurality of current output circuits that are weighted by a factor of $2^n$ (n=0, 1, 2, . . . ).

7. A D/A converter for converting a digital signal to a current value, comprising:

a signal dividing device that divides said digital signal into a plurality of digital sub-signals;

a plurality of D/A sub-converters that convert individual digital sub-signals to current sub-values; and a synthesizing device that synthesizes said current sub-values, wherein:

said D/A sub-converters are each provided with;

a decoder that outputs a first decode signal corresponding to said digital sub-signals;

a decode signal register that holds said first decode signal from said decoder and outputs a second decode signal;

a bit adder circuit that adds common bits in said first decode signal provided by said decoder and said second decode signal provided by said decode signal register and generates a third decode signal having a bit length equal to bit lengths of said first decode signal and said second decode signal; and a current conversion circuit having a plurality of current output circuits that switch between an operating state and a stopped state based upon said third decode signal, that outputs a current value corresponding to the number of current output circuits selected in correspondence to said second decode signal.

8. A D/A converter according to claim 7, wherein:

said decode signal register is constituted by connecting a group of decode signal sub-registers in cascade over a plurality of stages and said bit adder circuit adds common bits in a plurality of second decode signals provided by said group of decode signal sub-registers and said first decode signal to generate said third decode signal.

9. A D/A converter according to claim 7, wherein:

said current conversion circuit is provided with a plurality of current output circuits that are weighted by a factor of $2^n$ (n=0, 1, 2, . . . ).

10. A D/A converter for converting a digital signal to a current value, comprising:

a signal dividing device that divides said digital signal into a plurality of digital sub-signals;

a plurality of D/A sub-converters that convert individual digital sub-signals to current sub-values; and a synthesizing device that synthesizes said current sub-values, wherein:

said D/A sub-converters are each provided with;

a data register that holds first digital data that have been input and outputs second digital data*[4];

a first decoder that outputs a first decode signal corresponding to said second digital signal;

a data selection circuit that compares sizes of said first digital signal and said second digital signal from said data register and outputs a third digital signal;

a second decoder that outputs a second decode signal corresponding to said third digital data; and a current conversion circuit having a plurality of current output circuits that switch between an operating state and a stopped state in correspondence to said second decode signal, that outputs a current value corresponding to the number of current output circuits selected in correspondence to said first decode signal.

11. A D/A converter according to claim 10, wherein:

said data register is constituted by connecting a group of data sub-registers in cascade over a plurality of stages and said data selection circuit compares a plurality of sets of said first digital data input to said group of data sub-registers and a plurality of sets of said second digital data output from said group of data sub-registers.

12. A D/A converter according to claim 10, wherein:

said current conversion circuit is provided with a plurality of current output circuits that are weighted by a factor of $2^n$ (n=0, 1, 2, . . . ).

* * * * *